(12) United States Patent
Itani

(10) Patent No.: US 7,856,595 B2
(45) Date of Patent: Dec. 21, 2010

(54) STRUCTURED DOCUMENT COMPRESSING APPARATUS AND METHOD, RECORD MEDIUM IN WHICH A STRUCTURED DOCUMENT COMPRESSING PROGRAM IS STORED, STRUCTURED DOCUMENT DECOMPRESSING APPARATUS AND METHOD, RECORD MEDIUM IN WHICH A STRUCTURED DOCUMENT DECOMPRESSING PROGRAM IS STORED, AND STRUCTURED DOCUMENT PROCESSING SYSTEM

(75) Inventor: Noriko Itani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1010 days.

(21) Appl. No.: 09/826,915

(22) Filed: Apr. 6, 2001

(65) Prior Publication Data

US 2002/0065822 A1 May 30, 2002

(30) Foreign Application Priority Data

Nov. 24, 2000 (JP) ............................. 2000-357568

(51) Int. Cl.
*G06N 3/00* (2006.01)
(52) U.S. Cl. .................................................... 715/234
(58) Field of Classification Search ................. 715/513, 715/804, 853, 517, 523, 530, 234, 243, 254, 715/255; 707/7, 102; 709/247; 717/104, 717/174; 704/4, 7; 713/100
See application file for complete search history.

(56) References Cited

U.S. PATENT DOCUMENTS 5,504,891 A * 4/1996 Motoyama et al. .......... 715/513
5,544,298 A * 8/1996 Kanavy et al. .............. 715/804
5,572,731 A * 11/1996 Morel et al. ................. 717/104
5,748,188 A * 5/1998 Hu et al. ...................... 715/853
5,854,597 A   12/1998 Murashita et al.
5,963,743 A * 10/1999 Amberg et al. ............... 717/174
5,999,929 A * 12/1999 Goodman ....................... 707/7
6,230,168 B1 * 5/2001 Unger et al. ............... 715/501.1

(Continued)

FOREIGN PATENT DOCUMENTS

JP            9-261072        10/1997

(Continued)

OTHER PUBLICATIONS

Japanese Patent Office Action, mailed Aug. 5, 2008 and issued in corresponding Japanese Patent Application No. 2000-357568, includes English translation (4 pgs).

*Primary Examiner*—Kyle R Stork
(74) *Attorney, Agent, or Firm*—Staas & Halsey LLP

(57) ABSTRACT

Structured documents can be compressed without impairing visual recognizability of data structure or flexibility/expandability of structured documents. This invention provides a tag list generating unit for generating a single tag list in which tags in a structured document are listed in the order of appearance, a structured document compressing unit for generating a compressed document in which tags in each of the structured documents are replaced with predetermined delimiter codes, and an outputting unit for outputting the single tag list generated by the tag list generating unit along with a plurality of compressed documents generated from a plurality of structured documents by the structured document compressing unit, in correspondence with one another. This invention is applied to XML and SGML structured documents, and is effective, for example, when a number of slips having the same format are compressed/decompressed.

27 Claims, 19 Drawing Sheets

,,STUV,
,1111,
,
,,AAA COMPANY,
,1234,
,ABCD,
,980,
,
,

U.S. PATENT DOCUMENTS

| | | | |
|---|---|---|---|
| 6,247,128 B1 * | 6/2001 | Fisher et al. | 713/100 |
| 6,330,530 B1 * | 12/2001 | Horiguchi et al. | 704/4 |
| 6,463,440 B1 * | 10/2002 | Hind et al. | 707/102 |
| 6,507,874 B1 * | 1/2003 | Tuniman et al. | 709/247 |
| 6,535,886 B1 * | 3/2003 | Koontz | 707/102 |
| 6,635,088 B1 * | 10/2003 | Hind et al. | 715/513 |
| 6,745,161 B1 * | 6/2004 | Arnold et al. | 704/7 |
| 6,871,320 B1 | 3/2005 | Morihara et al. | |
| 7,043,686 B1 * | 5/2006 | Maruyama et al. | 715/513 |

FOREIGN PATENT DOCUMENTS

| | | |
|---|---|---|
| JP | 2000-101442 | 4/2000 |

* cited by examiner

FIG. 3A

```
<ORDER-SLIP>
<CUSTOMER> <NAME>STUV</NAME>
            <TELEPHONE-NUMBER>1111</TELEPHONE-NUMBER>
</CUSTOMER>
<PRODUCT>  <MANUFACTURER>AAA COMPANY</MANUFACTURER>
            <PRODUCT-NUMBER>1234</PRODUCT-NUMBER>
            <PRODUCT-NAME>ABCD</PRODUCT-NAME>
            <PRICE>980</PRICE>
</PRODUCT>
</ORDER-SLIP>
```

FIG. 3B

```
<ORDER-SLIP>
<CUSTOMER> <NAME></NAME>
            <TELEPHONE-NUMBER></TELEPHONE-NUMBER>
</CUSTOMER>
<PRODUCT>  <MANUFACTURER></MANUFACTURER>
            <PRODUCT-NUMBER></PRODUCT-NUMBER>
            <PRODUCT-NAME></PRODUCT-NAME>
            <PRICE></PRICE>
</PRODUCT>
</ORDER-SLIP>
```

FIG. 3C

```
,
, ,STUV,
  ,1111,

,
, ,AAA COMPANY,
  ,1234,
  ,ABCD,
  ,980,

\<PRODUCT\> \<MANUFACTURER\>AAA COMPANY\</MANUFACTURER\>
 \<PRODUCT-NUMBER\>1111\</PRODUCT-NUMBER\>
 \<PRICE\>980\</PRICE\>
\</PRODUCT\>

FIG. 6B

PRODUCT
MANUFACTURER
/MANUFACTURER
PRODUCT-NUMBER
/PRODUCT-NUMBER
PRICE
/PRICE
/PRODUCT

FIG. 6C

, , AAA COMPANY, ,1111, ,980, ,

FIG. 6D

, , AAA COMPANY/,1111/,980//

FIG. 9A

```
<PRODUCT>
    <MANUFACTURER>AAA COMPANY</MANUFACTURER>
    <PRODUCT-NUMBER PRODUCT-NAME='ABCD' COLOR='BLUE' >1111</PRODUCT-NUMBER>
    <PRICE>980</PRICE>
</PRODUCT>
```

FIG. 9B

```
PRODUCT
MANUFACTURER
/MANUFACTURER
PRODUCT-NUMBER
=PRODUCT-NAME
=COLOR
/PRODUCT-NUMBER
PRICE
/PRICE
/PRODUCT
```

FIG. 9C

,, AAA COMPANY, ,ABCD,BLUE,1111, ,980, ,

FIG. 9D

,, AAA COMPANY/,ABCD=BLUE=1111/,980 //

FIG. 11A

PRODUCT

MANUFACTURER

/MANUFACTURER

PRODUCT-NUMBER

/PRODUCT-NUMBER

PRICE

/PRICE

/PRODUCT

FIG. 11B

<PRODUCT><PRODUCT>300</PRICE>
       <PRODUCT-NUMBER>B7</PRODUCT-NUMBER>
</PRODUCT>

FIG. 11C

<PRODUCT><MANUFACTURER></MANUFACTURER>
       <PRODUCT-NUMBER>B7</PRODUCT-NUMBER>
       <PRICE>300</PRICE>
</PRODUCT>

FIG. 14A

```
<ORDER-SLIP><CUSTOMER>STUV</CUSTOMER>
<PRODUCT><MANUFACTURER>AAA COMPANY</MANUFACTURER>  ⎫
        <PRODUCT-NUMBER>111A</PRODUCT-NUMBER>       ⎬ SUBDOCUMENT
        <PRICE>980</PRICE>                          ⎭
</PRODUCT>
<PRODUCT><MANUFACTURER>BBB COMPANY</MANUFACTURER>  ⎫
        <PRODUCT-NUMBER>111B</PRODUCT-NUMBER>       ⎬ SUBDOCUMENT
        <PRICE>500</PRICE>                          ⎭
</PRODUCT>
<PRODUCT><MANUFACTURER>CCC COMPANY</MANUFACTURER>  ⎫
        <PRODUCT-NUMBER>111C</PRODUCT-NUMBER>       ⎬ SUBDOCUMENT
        <PRICE>750</PRICE>                          ⎭
</PRODUCT>
</ORDER-SLIP>
```

FIG. 14B

```
<ORDER-SLIP><CUSTOMER>STUV</CUSTOMER>
    <PRODUCT>                          ⎫
      , AAA COMPANY, ,111A, ,980,      ⎬ SUBDOCUMENT
    </PRODUCT>                         ⎭
    <PRODUCT>                          ⎫
      , BBB COMPANY, ,111B, ,500,      ⎬ SUBDOCUMENT
    </PRODUCT>                         ⎭
    <PRODUCT>                          ⎫
      , CCC COMPANY, ,111C, ,750,      ⎬ SUBDOCUMENT
    </PRODUCT>                         ⎭
</ORDER-SLIP>
```

STRUCTURED DOCUMENT COMPRESSING APPARATUS AND METHOD, RECORD MEDIUM IN WHICH A STRUCTURED DOCUMENT COMPRESSING PROGRAM IS STORED, STRUCTURED DOCUMENT DECOMPRESSING APPARATUS AND METHOD, RECORD MEDIUM IN WHICH A STRUCTURED DOCUMENT DECOMPRESSING PROGRAM IS STORED, AND STRUCTURED DOCUMENT PROCESSING SYSTEM

BACKGROUND OF THE INVENTION

1) Field of the Invention

The present invention relates to a technique of compression and decompression of a structured document in SGML (Standard Generalized Markup Language), XML (extensible Markup Language) or the like, particularly, to a technique suitable for use when a number of structured documents having a common data structure such as a number of slips having the format or the like are handled.

2) Description of the Related Art

In these years, a volume of data handled by a computer increases since various types of data such as character codes, image data and the like become handled by the computer. When such a large volume of data is handled as it is, a large storage capacity is required to store the data, and a lot of time is also required to transmit the data. If redundant parts in the data are removed and the data is compressed, it is possible to decrease the storage capacity and speed up the transmission to a remote place. As a method being able to compress various data in one system, there has been proposed, for example, universal coding.

As general universal data compressing methods, there are a dictionary-based coding system using analogy of data sequences, and a probability statistical coding system using frequency of occurrence of a data sequence (refer to, for example, *Introduction to Document Data Compressing Algorithm*; Tomohiko Uematsu, CQ Pub.) In either system, generated compressed data is binary codes (for example, all codes, 0x00 to 0xFF, are used in the case of eight bit codes). FIG. 19 is a diagram for illustrating general universal data compression, for example. As shown in FIG. 19, XML documents 1, 2 and 3 are compressed and converted into binary data 1, 2 and 3 in universal data compression.

On the other hand, there is a move to unify forms of data to be handled in computers. Namely, it is aimed to unify data forms that depend on computers or applications, enabling various computers or applications to handle the data.

As a standard to unify data forms, XML is recommended in February, 1998 by W3C (World Wide Web Consortium). XML is a subset of SGML that is the similar standard. In XML, tags are embedded in the document, whereby a data structure of the document is described. A document described in XML or SGML is generally called a structured document.

The structured document has advantages of high flexibility/extensibility with respect to the data structure because of the tags embedded for indication of the data structure.

Additionally, a tag is described in a text understandable for users, making a data structure of the XML document visually recognizable. Accordingly, it is easy to exchange data, and to unify plural kinds of description systems in an unstrict manner. This implies that data of a structured document never depends on the application.

Hereinafter, a character string sandwiched between "<" and ">" is called a tag, "<character-string>" is called a start tag, "</character-string>" is called an end tag, and a character string described in a region sandwiched between a start tag and an end tag is called an element (or an element content), according to the XML standard.

XML documents described according to the XML standard has nowadays been frequently encountered, particularly, in fields of Web and database. In particular, XML documents have been widely used in EDI (Electric Data Interchange), EC (Electric Commerce), portable telephone service, digital television service, Web service, etc.

FIG. 20 is a block diagram showing an example of a structure of a general system handling the above-described XML documents. The system shown in FIG. 20 comprises a hard disk (database) 10, a reading unit 20, a memory expanding unit 30 and a memory 40.

The hard disk (database) 10 stores and holds XML documents (three XML documents, 1, 2, 3 in FIG. 20). The reading unit 20 reads out the XML documents in the hard disk 10 to the memory expanding unit 30.

The memory expanding unit 30, which comprises an analyzing unit 31, a generating unit 32 and a storing unit 33, expands the XML documents inputted from the reading unit 20 on the memory 40.

The analyzing unit 31 analyzes tags in each of the XML documents to be expanded on the memory 40 to analyze a data structure (tree structure) of the XML document. The generating unit 32 generates document data according to each of the XML documents on the basis of a result of data structure analysis by the analyzing unit 31. The storing unit 33 expands the document data generated by the generating unit 32 on the memory 40 and stores it in the memory 40.

In the system in the above structure shown in FIG. 20, an XML document stored in the hard disk 10 is read out by the reading unit 20. When the read-out XML document is inputted to the memory expanding unit 30, the analyzing unit 31 analyzes a data structure (tree structure) of the XML document. The generating unit 32 then generates document data corresponding to the XML document according to a result of data structure analysis by the analyzing unit 31. The generated document data is expanded on the memory 40 and stored therein by the storing unit 33.

Meanwhile, XML documents have high flexibility/expandability with respect to the data structures, and is visually recognizable. A tag is described such that a meaning of the tag is comprehensible for users, which leads to a redundant description. This causes a large increase in data quantity of the XML document. For this, tit has ever been cherished to compress the XML document to decrease the data quantity.

When universal data compression is used, however, all compressed data are binary data as shown in, for example, FIG. 19, thus destroying one of the advantages of XML documents, visually recognizable data. Contents of the compressed data thus cannot be understood before decompressing the compressed data to reconstruct the original data. In consequence, without a decompression algorithm for the compressed data, data exchange or tag analysis are impossible.

When the XML document is expanded on the memory 40 as described above with reference to FIG. 20, a load of the tag analyzing process (data structure analyzing process) by the analyzing unit 31 is increased, since the data structure of the XML document (structured document) is embedded as tags in the XML document. Particularly, when a number of XML documents (for example, order slips) having a common data structure are expanded on the memory 40, it is necessary to perform the data structure analysis on each of the XML documents separately, in spite of a common data structure being shared. Resultantly, wasteful tag analysis, thus necessitated, causes an increased processing load.

SUMMARY OF THE INVENTION

In the light of the above problems, one object of the present invention is to compress a structured document, without impairing the visual recognizability of the data structure or flexibility/expandability, a part of the advantages of XML documents, thereby decreasing a data quantity of the structured document. In addition, it is another object to eliminate wasteful tag analysis when handling a number of structured documents having a common data structure, thereby decreasing a load of the tag analysis.

The present invention therefore provides a first structured document compressing apparatus. The first structured document compressing apparatus is for compressing a plurality of structured documents having a common data structure, the apparatus comprising: a tag list obtaining unit for obtaining a single tag list, common to the plural structured documents, that lists tags in the order of appearance; a structured document compressing unit for generating a plurality of compressed documents in which tags in the individual structured documents are replaced with predetermined delimiter codes; and an outputting unit for outputting the single tag list, which is obtained by the tag list obtaining unit, and also the plurality of compressed documents, which are generated individually from the plural structured documents by the structured document compressing unit, in correspondence with one another.

The present invention further provides a first structured document decompressing apparatus. The first structured document decompressing apparatus is for decompressing a plurality of compressed documents generated by the first structured document compressing apparatus. The first structured document decompressing apparatus comprises a duplicating unit for expanding/duplicating a data structure corresponding to the tag list, as a duplicated data structure, on a memory; and a writing unit for writing element contents of each of the compressed documents into predetermined regions of the duplicated data structure extended on the memory, in accordance with a correspondence between a position of a tag in the duplicated data structure and a position of the predetermined delimiter code in each of the compressed documents.

The present invention still further provides a first structured document processing system comprising the above first structured document compressing apparatus and the above first structured document decompressing apparatus in order to process a plurality of structured documents having a common data structure.

In the above first structured document compressing apparatus of this invention or the above first structured document compressing apparatus in the first structured document processing system of this invention, a data structure common to a plurality of structured documents is obtained as a single tag list by the tag list obtaining unit. Each of the structured documents is converted into a compressed document in a tag compressing process (process of replacing tags with predetermined delimiter codes) by the structured document compressing unit. After that, the single tag list and the plural compressed documents are outputted, as the result of compression of the plural structured documents, from the outputting unit.

Consequently, a data structure (one tag list) and data contents (plural compressed documents) are outputted separately, as the result of compression of plural structured documents.

In the compressed document generated as above, only tags are replaced with predetermined delimiter codes without any changes in positions of the tags and data contents (element contents). It is therefore possible to compress structured documents without impairing the visual recognizability of the data structure or flexibility/expandability, which forms a part of the advantages of the structured documents.

In the above first structured document decompressing apparatus of this invention or the structured document decompressing apparatus in the first structured document processing system of this invention, a data structure corresponding to a tag list is expanded and duplicated as a duplicated data structure for each of compressed documents on the memory. Element contents in each of the compressed documents are written into predetermined regions in the duplicated data structure on the memory by the writing unit while correlating a position of a tag in the duplicated data structure with a position of a predetermined delimiter code in each of the compressed documents. Each of the compressed documents (each of structured documents) is decompressed in an expanded state on the memory.

At this time, since results of compression of the plural structured documents are output, as a data structure (a single tag list) and data contents (plural compressed documents), separately. For this, once an analyzing process is performed on one tag list to obtain a data structure common to the plural compressed documents, it is possible to duplicate the obtained data structure to be shared. It is thus unnecessary to perform tag analysis on each of the compressed documents.

The present invention still further provides a second structured document compressing apparatus. The second structured document compressing apparatus is used as a structured document compressing unit in the above first structured document compressing apparatus in order to compress a structured document. The second structured document compressing apparatus comprises a tag detecting unit for detecting each tag in the structured document; and a tag replacement unit for replacing the tag, detected by the tag detecting unit, with a predetermined delimiter code.

The present invention still further provides a second structured document decompressing apparatus. The second structured document decompressing apparatus is for decompressing a compressed document generated by the second structured document compressing apparatus of this invention. The second structured document decompressing apparatus comprises a tag list holding unit for holding a tag list in which tags in the structured document are listed in the order of appearance; a delimiter code detecting unit for detecting each of the predetermined delimiter codes in the compressed document; and a tag restoring unit for replacing the predetermined delimiter code, detected by the delimiter code detecting unit, with a corresponding tag on the tag list, in accordance with a correspondence between a position of the tag in the tag list and a position of the predetermined delimiter code detected by the delimiter code detecting unit.

In the second structured document decompressing apparatus of this invention, when a tag in the structured document is detected by the tag detecting unit, the tag is replaced with a predetermined delimiter code by the tag replacement unit. A compressed document is generated in such a simple replacing process.

In the generated compressed document, only tags are replaced with predetermined delimiter codes, without any changes in positions of the tag and data contents (element contents), as stated above. In consequence, it is possible to compress a structured document, without impairing the visual recognizability of a data structure or flexibility/expandability, which forms a part of the advantages of the structured documents.

In the above second structured document decompressing apparatus of this invention, a tag list corresponding to a compressed document to be decompressed is beforehand held in the tag list holding unit. When a delimiter code in the compressed document is detected by the delimiter code detecting unit, the delimiter code is replaced, by the tag restoring unit, with a tag corresponding to the delimiter code.

At this time, the tag restoring unit recognizes which tag in the tag list the detected delimiter code corresponds to, by correlating a position of the tag in the tag list with a position of the delimiter code detected by the delimiter code detecting unit, thereby replacing the delimiter code with an appropriate tag, thus restoring the original tag. The compressed document is thereby decompressed, reconstructing the original structured document.

The present invention still further provides a third structured document compressing apparatus comprising a subdocument extracting unit for extracting a subdocument, which is a region sandwiched between a start tag and an end tag that have a predetermined element name, from the structured document; a tag detecting unit for detecting each tag in the subdocument extracted by the subdocument extracting unit; and a tag replacement unit for replacing the tag, detected by the tag detecting unit, with a predetermined delimiter code.

The present invention still further provides a first structured document compressing method. The first structured document compressing method is for compressing a plurality of structured documents having a common data structure. The method comprises the steps of: obtaining a single tag list, common to the plural structured documents, that lists tags, in the order of appearance; generating a plurality of compressed documents in which tags in the individual structured documents are replaced with predetermined delimiter codes; and outputting the single tag list and the plurality of compressed documents generated from the plural structured documents, in correspondence with one another.

The present invention still further provides a second structured document compressing method comprising the steps of detecting a tag in the structured document; and replacing the tag with a predetermined delimiter code.

The present invention still further provides a third structured document compressing method comprising the steps of extracting a subdocument, which is a region sandwiched between a start tag and an end tag that have a predetermined element name, from the structured document; detecting a tag in the subdocument; and replacing the detected tag with a predetermined delimiter code.

The present invention still further provides a computer readable record medium which stores a structured document compressing program for instructing a computer to execute a function of compressing a plurality of structured documents having a common data structure, and the structured document compressing program instructs the computer to function as the above various structured document compressing apparatuses.

The present invention still further provides a third compressed document decompressing apparatus. The third compressed document decompressing apparatus is for decompressing a compressed document generated by replacing tags in a subdocument, which is a region, in an original structured document, sandwiched between a start tag and an end tag that have a predetermined element name, with predetermined delimiter codes. The apparatus comprises: a tag list holding unit for holding a tag list in which tags in the subdocument are listed in the order of appearance; a subdocument extracting unit for extracting the subdocument from the compressed document; a delimiter code detecting unit for detecting each of the predetermined delimiter codes in the subdocument extracted by the subdocument extracting unit; and a tag restoring unit for replacing the predetermined delimiter code, detected by the delimiter code detecting unit, with a corresponding tag on the tag list, in accordance with a correspondence between a position of the tag in the tag list and a position of the predetermined delimiter code detected by the delimiter code detecting unit.

The present invention still further provides a first compressed document decompressing method. The first compressed document decompressing method is for decompressing a plurality of compressed documents, which is generated by replacing tags in a plurality of original structured documents having a common data structure with predetermined delimiter codes, on the basis of a tag list in which tags in the plural original structured documents are listed in the order of appearance. The method comprises the steps of: expanding/duplicating a data structure corresponding to the tag list, as a duplicated data structure, on a memory; and writing element contents of each of the compressed documents into predetermined regions of the duplicated data structure extended on the memory, in accordance with a correspondence between a position of a tag in the duplicated data structure and a position of the predetermined delimiter code in each of the compressed documents.

The present invention still further provides a second compressed document decompressing method. The second compressed document decompressing method is for decompressing a compressed document generated by replacing tags in an original structured document with predetermined delimiter codes. The method comprising the steps of: holding a tag list in which tags in the structured document are listed in the order of appearance; detecting the predetermined delimiter codes in the compressed document; and replacing the detected predetermined delimiter code with a corresponding tag on the tag list, in accordance with a correspondence between a position of the detected predetermined delimiter code and a position of the tag in the tag list.

The present invention still further provides a third compressed document decompressing method. The third compressed document decompressing method is for decompressing a compressed document generated by replacing tags in a subdocument, which is a region, in an original structured document, sandwiched between a start tag and an end tag that have a predetermined element name, with predetermined delimiter codes. The method comprises the steps of: holding a tag list in which tags in the subdocument are listed in the order of appearance; extracting the subdocument from the compressed document; detecting the predetermined delimiter codes in the extracted subdocument; and replacing the detected predetermined delimiter code with a corresponding tag on the tag list, in accordance with a correspondence between a position of the detected predetermined delimiter code and a position of the tag in the tag list.

The present invention still further provides a computer readable record medium which stores a structured document decompressing program for instructing a computer to execute a function of decompressing a plurality of compressed documents generated by replacing tags, in structured documents having a common data structure, with predetermined delimiter codes on the basis of a tag list in which tags in the plural structured documents are listed in the order appearance, and the structured document decompressing program instructs the computer to function as the above various structured document decompressing apparatus.

The present invention still further provides a second structured document processing system which comprises the above second structured document compressing apparatus and the above second structured document decompressing apparatus.

The present invention still further provides a third structured document processing system which comprises the above third structured document compressing apparatus and the above third structured document decompressing apparatus.

The present invention provides the following effects and advantages:

(1) In a compressed document generated according to this invention, since only tags are replaced with predetermined delimiter codes without any changes in data contents (element contents), the structured document can be compressed to decrease a data quantity of the structured document, without impairing the visual recognizability of the data structure or flexibility/expandability, which forms a part of the advantages of structured documents. Accordingly, it is possible to store the structured document in a reduced amount of storage area, and also to transmit the structured document data at an increased speed.

(2) Results of compression of a plurality of structured documents are output as a data structure (a single tag list) and data contents (a plurality of compressed documents), separately. Once the analyzing process is performed on the tag list to obtain a data structure common to the plural compressed documents, it is unnecessary to perform the tag analysis on each of the compressed documents, separately, because the obtained data structure can be duplicated to be used for all the compressed documents. When a number of structured documents having a common data structure are handled, wasteful tag analysis would thus be eliminated, significantly decreasing a load of tag analysis, thereby realizing a remarkable increase in processing speed when the structured documents are expanded on the memory.

(3) An extremely simple replacing process of replacing tags, detected in a structured document, with predetermined delimiter codes, allows compression of a structured document and a decrease in data quantity of the structured document, without impairing the visual recognizability of the data structure or flexibility/expandability, which are a part of the advantages of structured documents. This reduces an amount of storage area required to store the structured document, and increases the transmission speed of the structured document. When the structured document is compressed in the above manner, the compressed document can be decompressed into the original structured document, in a simple way of replacing predetermined delimiter codes with predetermined tags while correlating the predetermined delimiter code with a tag in a tag list for the compressed document.

(4) When one structured document is made up of a plurality of regions (subdocuments) having a common data structure, the subdocument, a region sandwiched between a start tag and an end tag that have a predetermined element name, is extracted from the structured document, and tags in each of the subdocuments are replaced with predetermined delimiter codes. It is thereby possible to compress the structured document without impairing the visual recognizability of the data structure of the subdocument or flexibility/expandability, which is a part of the advantages of structured documents, and also to decrease a data quantity of the structured document. This decreases an amount of storage area required to store the structured document, and increases the transmission speed of the structured document data. If the structured document is compressed in the above manner, the document can be readily reconstructed when decompressed with a simple decompressing process such as of replacing predetermined delimiter codes, detected in the subdocument in the original document, with predetermined tags while correlating the predetermined delimiter code with the tag in a tag list for the subdocument.

(5) When replacing an attribute-bearing tag, which has an attribute value, the attribute-bearing tag is replaced with an attribute value and predetermined delimiter codes. Since the attribute value is such described in the compressed document as it is in the original document, the structured document can be compressed without impairing the visual recognizability of the attribute value. When the attribute-bearing tag replaced as above is restored, the attribute value relating to the attribute-bearing tag is correlated with an attribute name in an attribute list for the compressed document, whereby the attribute-bearing tag is readily restored.

(6) Tags and/or attributes in the structured document before compression are rearranged in a predetermined order according to a tag list and/or a tag/attribute list defining a predetermined data structure, and a tag and/or an attribute omitted in the structured document is supplemented. Even if the structured document involves deficiency such as reversed description order of tags or attributes, lack of description of a tag or an attribute, or the like, the structured document can be normalized such as to have a predetermined data structure. At the compression of a number of structured documents having a common data structure, even including a structured document with such deficiency, all the structured documents to be compressed are normalized, before undergoing the compressing process, so as to have a predetermined data structure defined in a tag list or a tag/attribute list. It is therefore possible to certainly manage and handle a number of structured documents (compressed documents) with one tag list or tag/attribute list.

(7) Correspondence between compressed documents and tag lists are managed by the tag list managing unit, or tag-list identification information to specify a tag list corresponding to a compressed document is added to the compressed document, whereby tag list groups can be handled collectively, correspondence between a compressed document and a tag list can be certainly understood, and a compressed document can be decompressed on the basis of a tag list corresponding to the compressed document. In a system which handles structured documents while compressing and decompressing the structured documents, it is possible to certainly obtain a tag list corresponding to each compressed document and also to perform an appropriate decompressing process, even if the decompression is executed on the structured documents (compressed documents) that includes ones with different types of data structures (that is, different tag lists).

(8) Tag list groups are held and managed on the management server, and a necessary tag list for the process is read out from the management server over the network, so that the tag list groups are collectively managed. Thus, it is unnecessary to manage plural kinds of tag lists for each compressing apparatus or decompressing apparatus, sharing the tag lists by a plurality of compressing apparatuses and decompressing apparatuses.

BRIEF DESCRIPTION OF THE INVENTION

Figure 4:
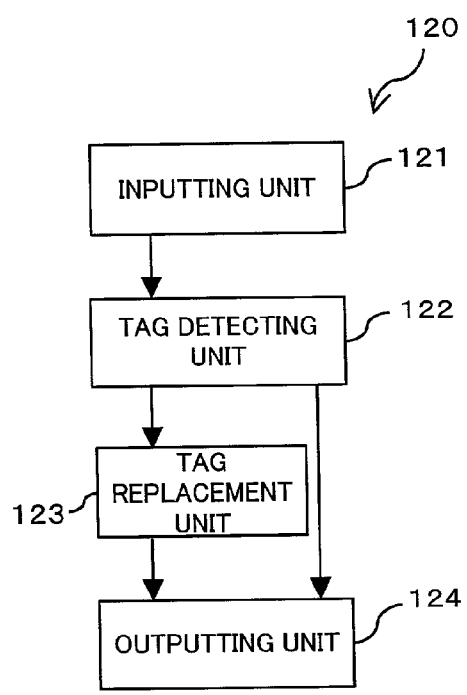
Figure 5:
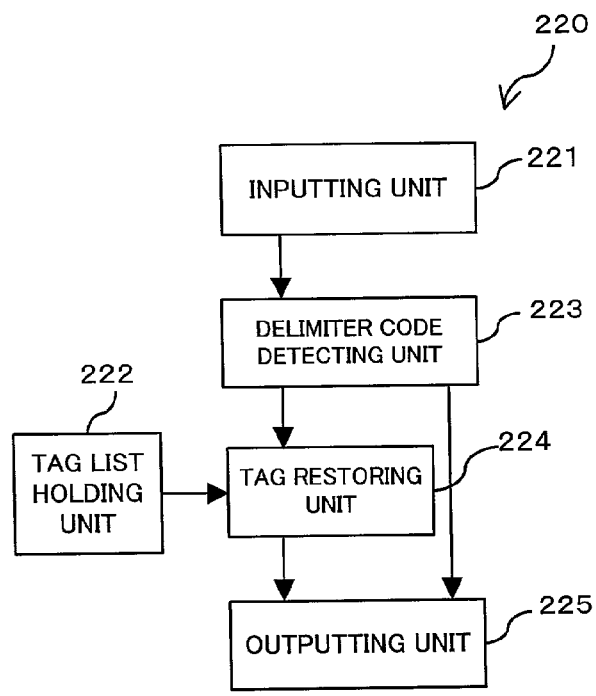
Figure 7:
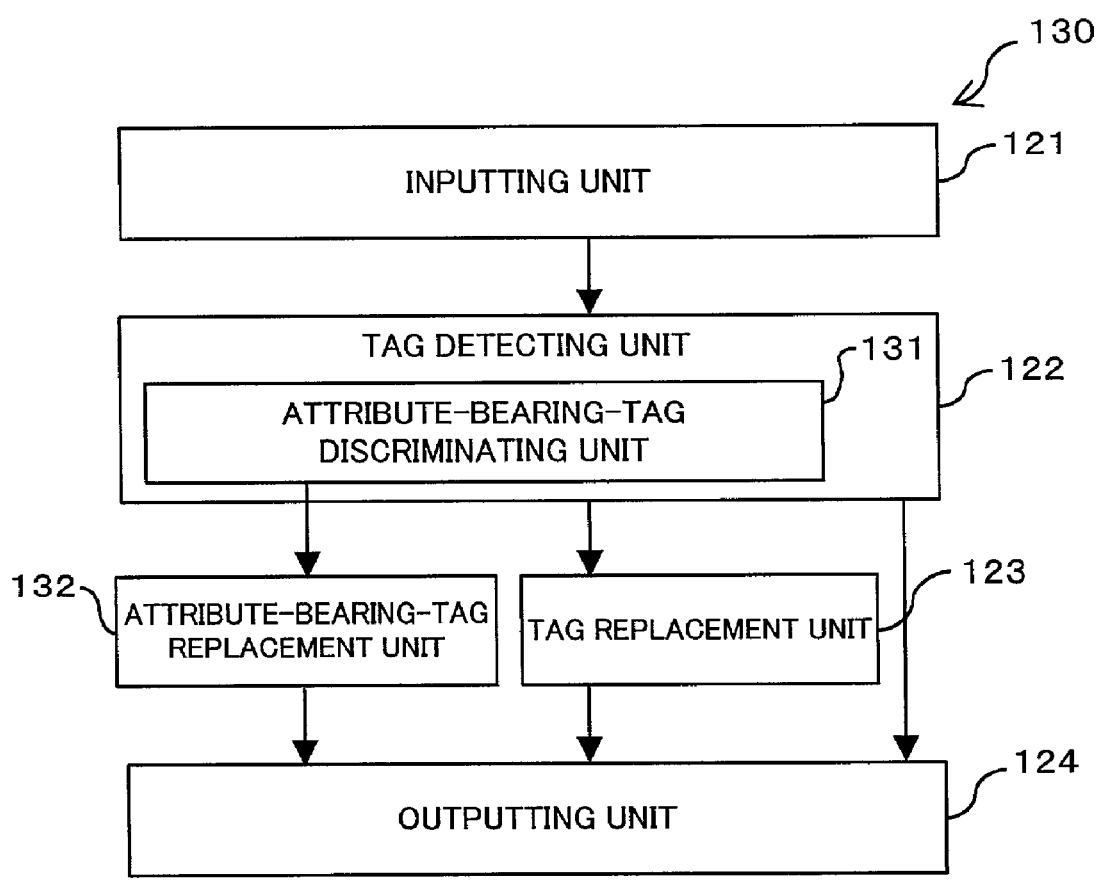
Figure 8:
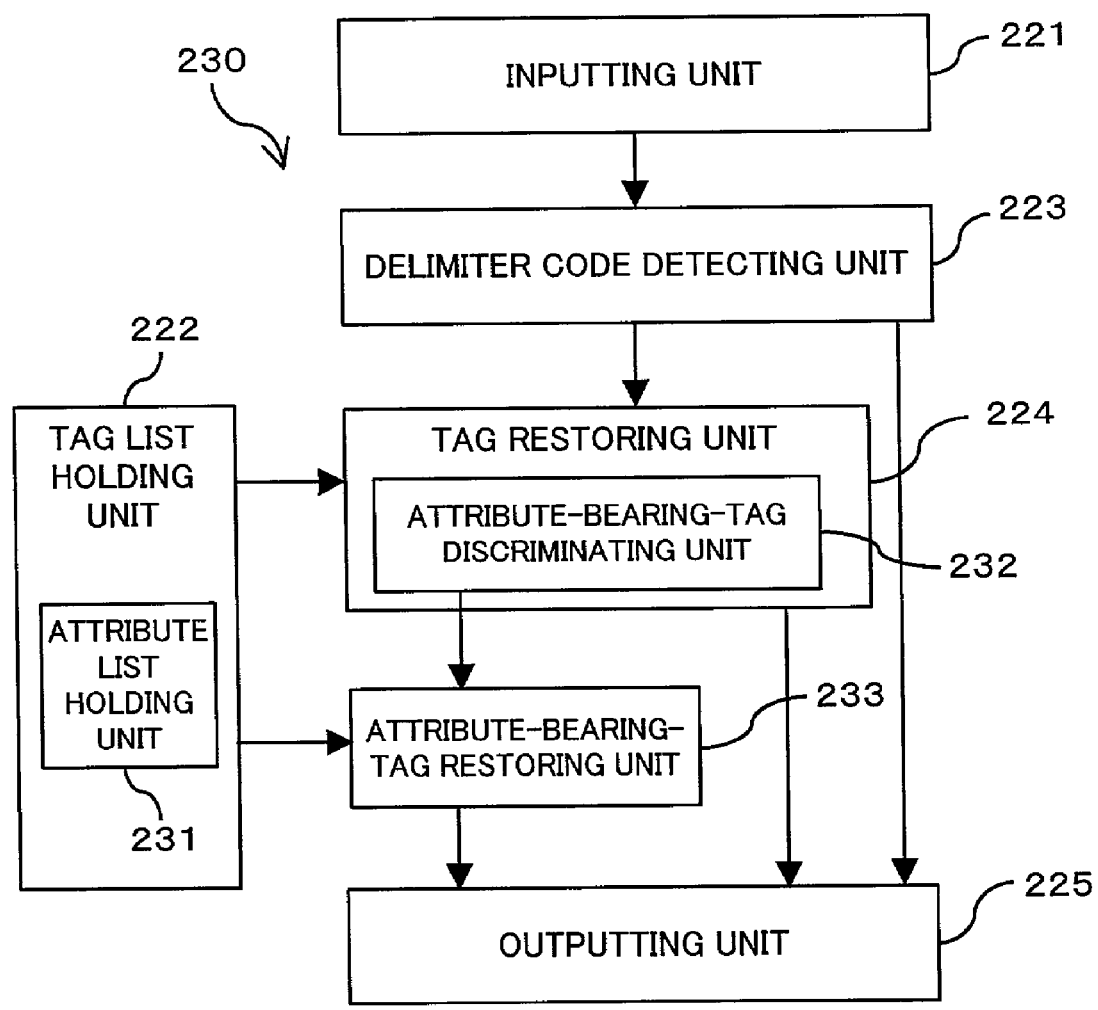
Figure 10:
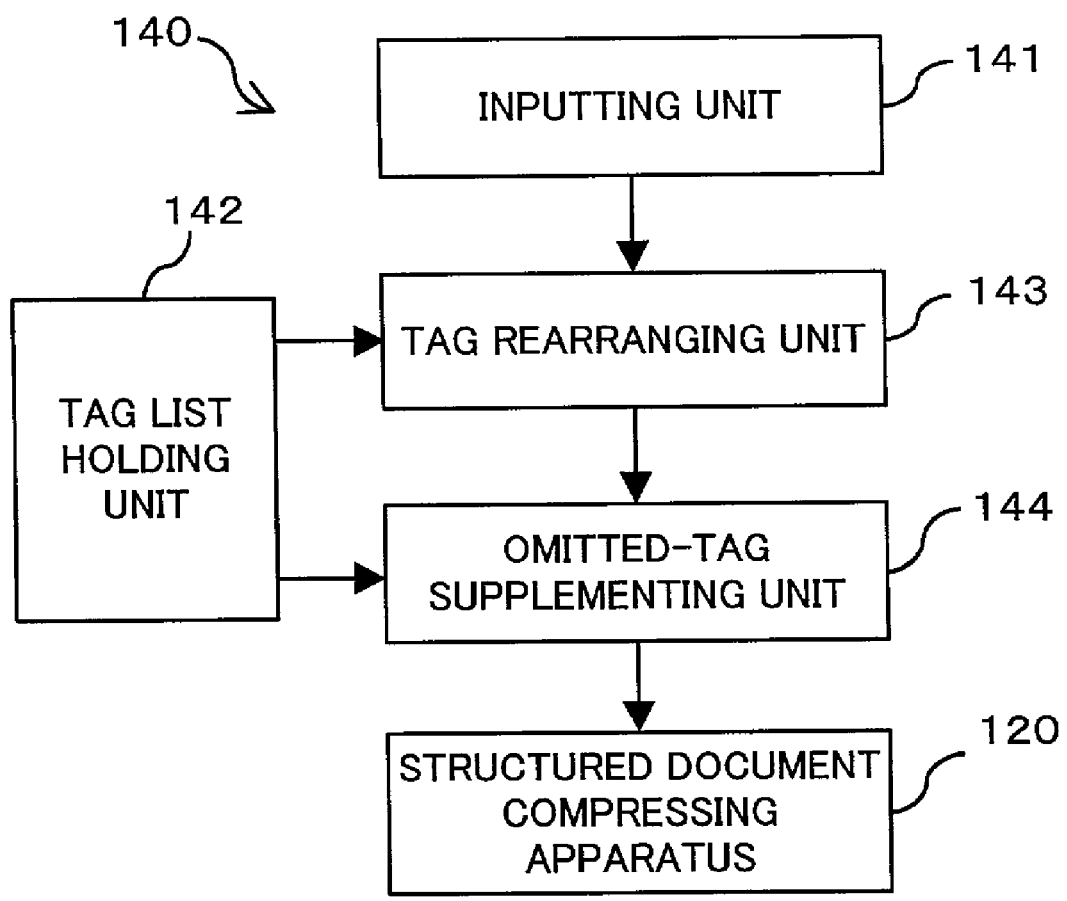
Figure 12:
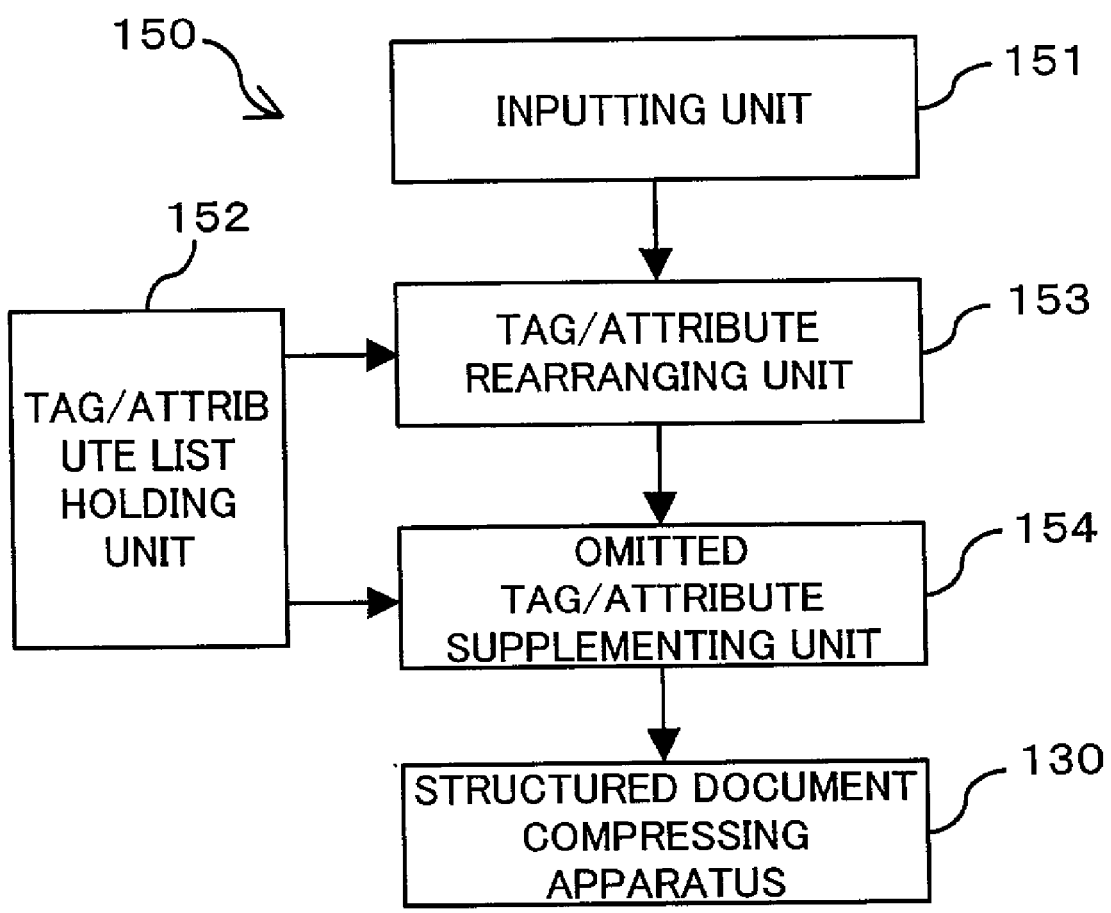
Figure 13:
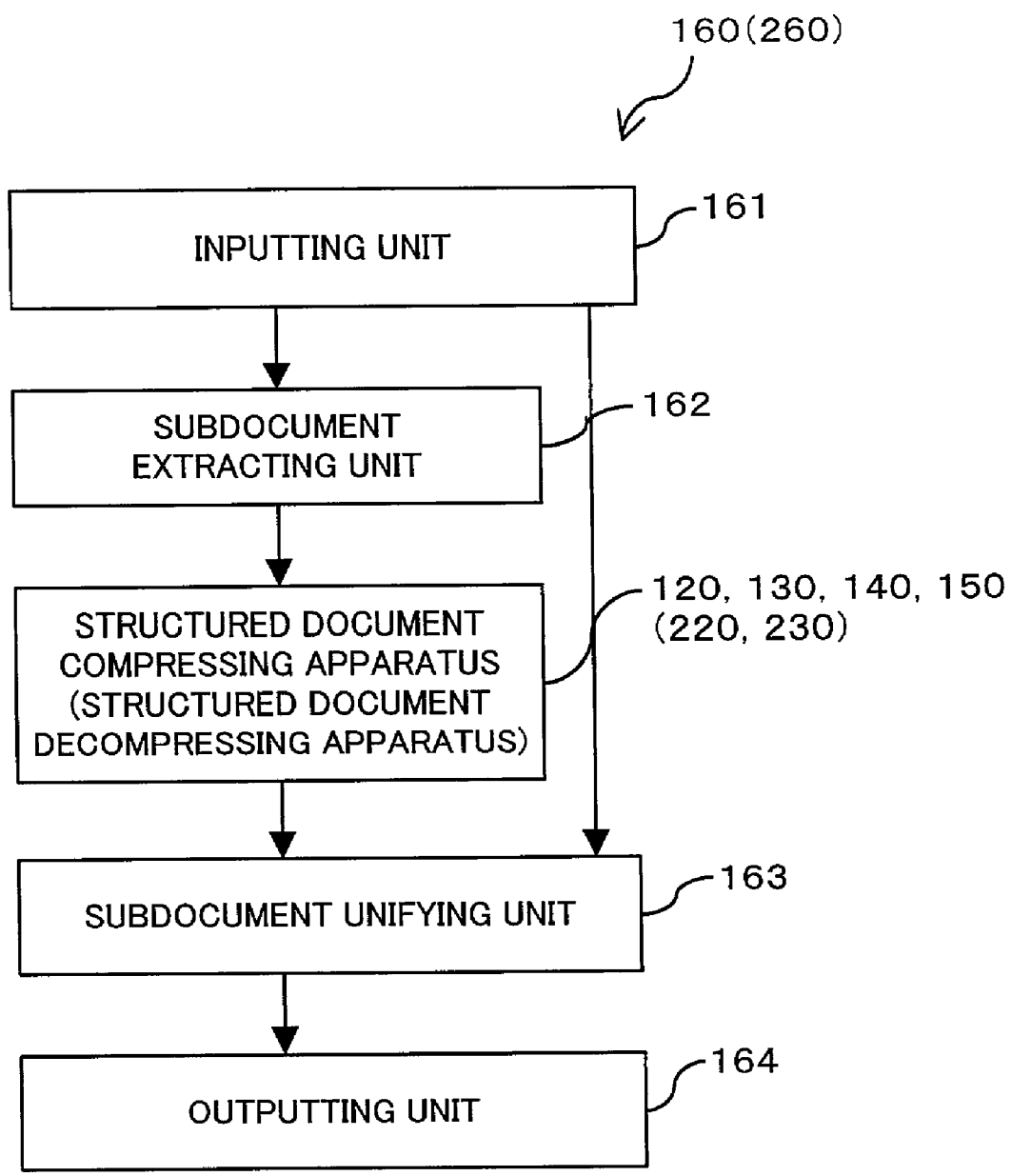
Figure 15:
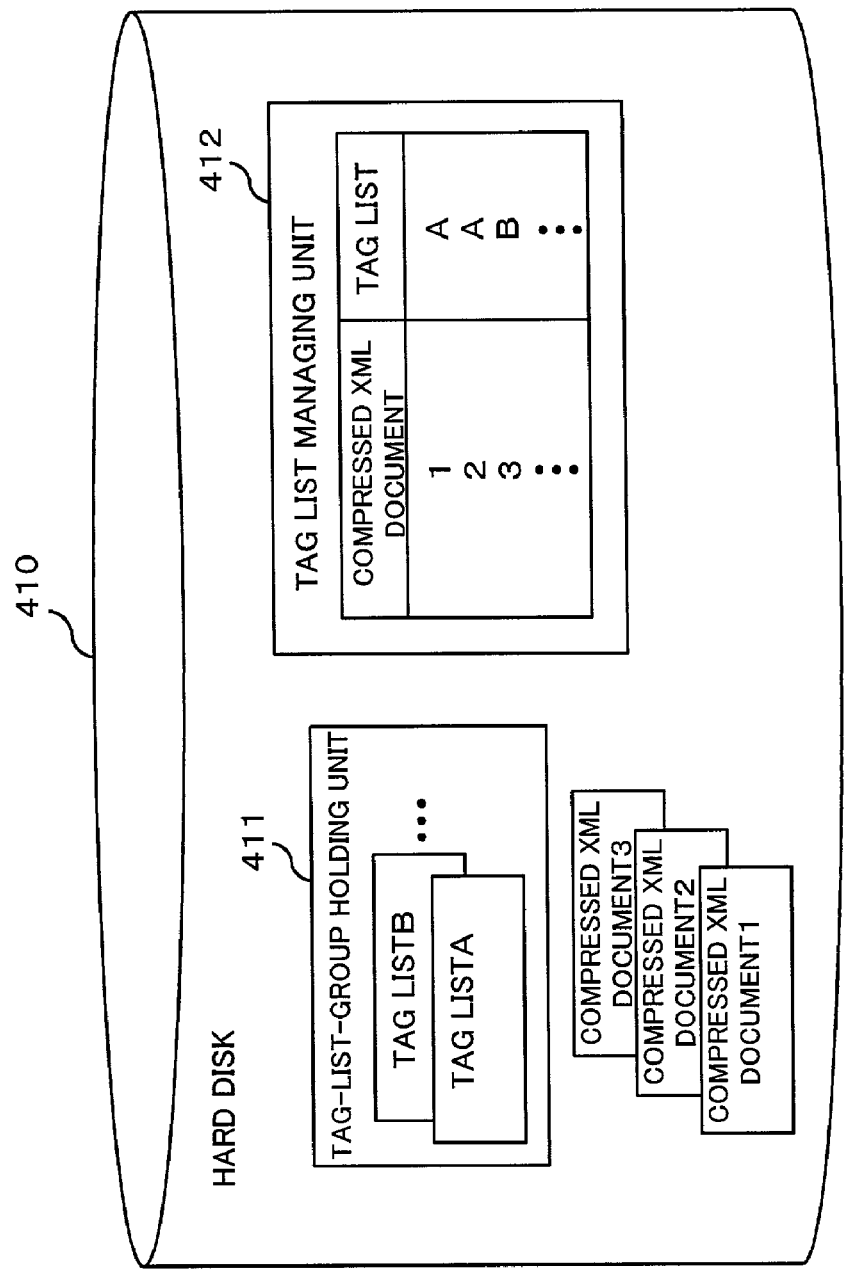
Figure 16:
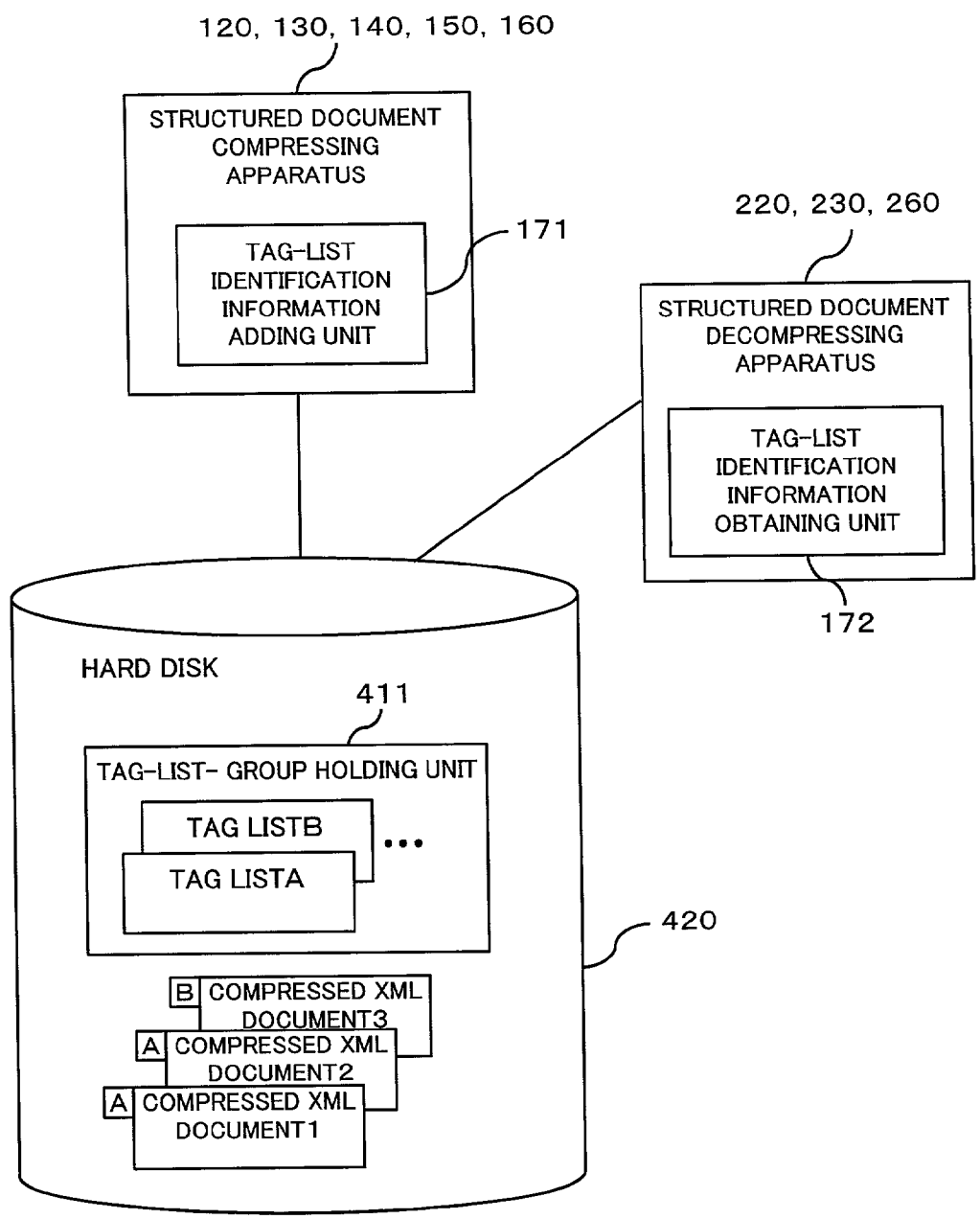
Figure 17:
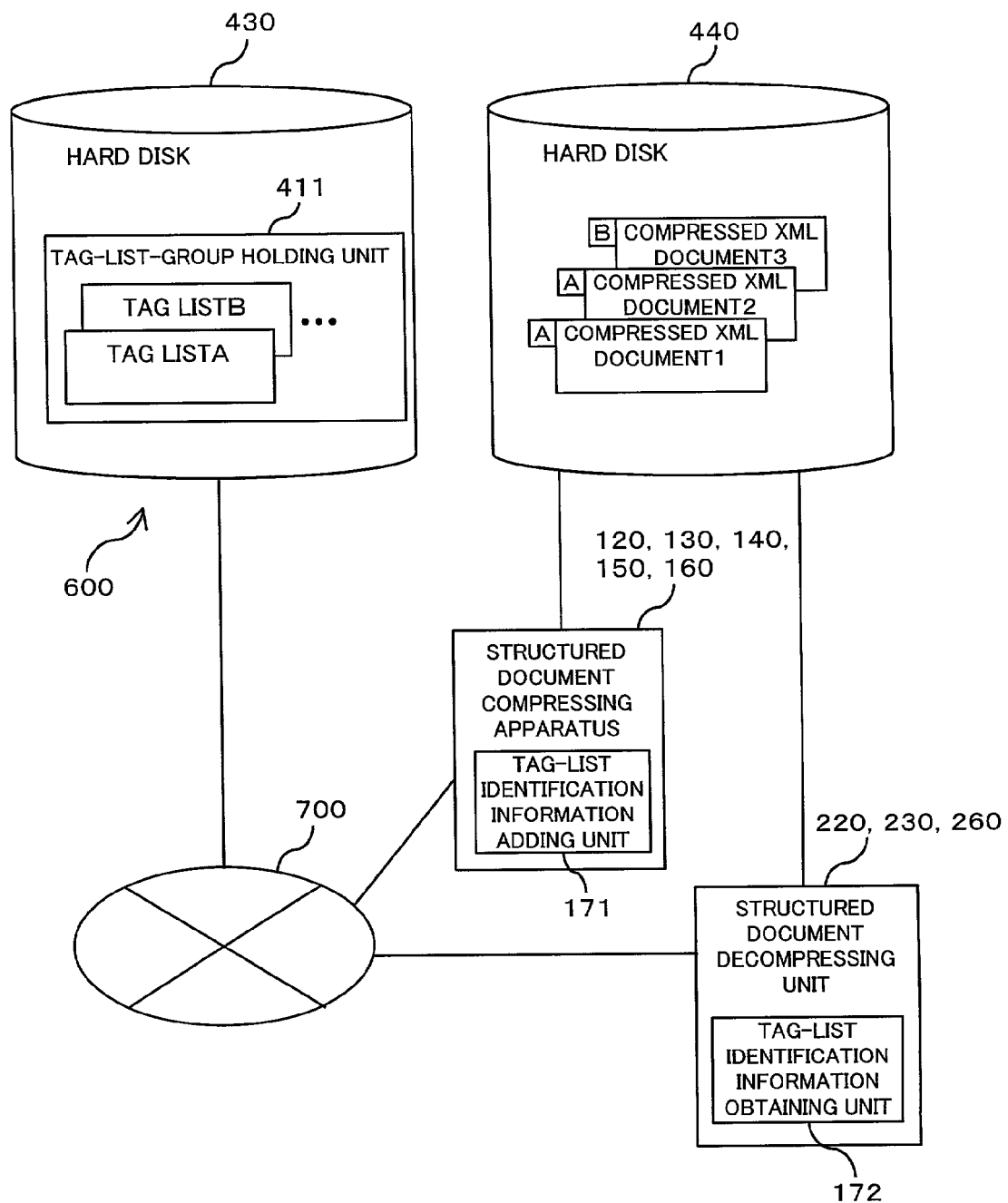
Figure 18:
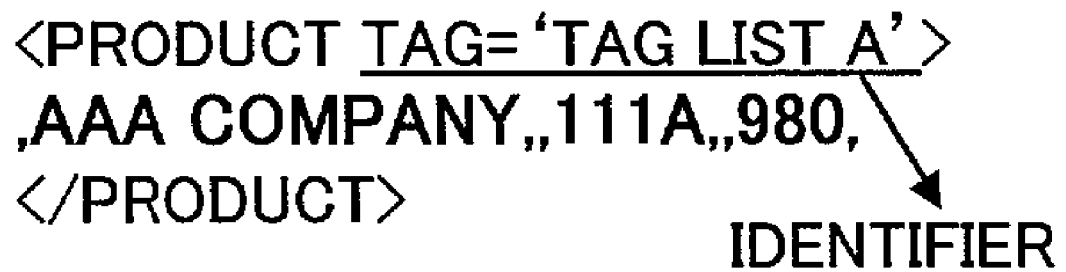
Figure 19:
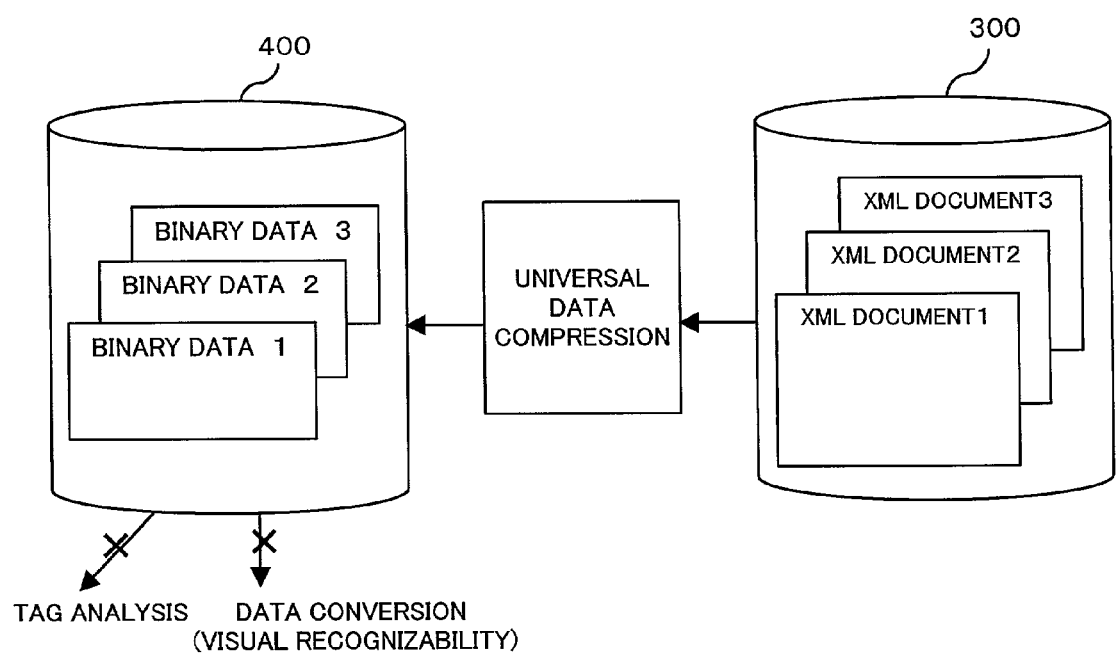

FIGS. 3A through 3C show an example of data according to the first embodiment; FIG. 3A is a diagram showing an example of an XML document; FIG. 3B is a diagram showing a tag list obtained from the XML document in FIG. 3A; FIG. 3C is a diagram showing a compressed state of the XML document in FIG. 3A;

FIG. 4 is a block diagram showing a structure of a structured document compressing apparatus according to a second embodiment of this invention;

FIG. 5 is a block diagram showing a structure of a structured document decompressing apparatus according to the second embodiment of this invention;

FIGS. 6A through 6D show examples of data according to the second embodiment; FIG. 6A is a diagram showing an example of an XML document; FIG. 6B is a diagram showing a tag list corresponding to the XML document in FIG. 6A; FIG. 6C is a diagram showing a compressed state of the XML document in FIG. 6A; FIG. 6D is a diagram showing another example of the compressed state of the XML document in FIG. 6A;

FIG. 7 is a block diagram showing a structure of a structured document compressing apparatus according to a third embodiment of this invention;

FIG. 8 is a block diagram showing a structure of a structured document decompressing apparatus according to the third embodiment of this invention;

FIGS. 9A through 9D show examples of data according to the third embodiment; FIG. 9A is a diagram showing an example of an XML document; FIG. 9B is a diagram showing a tag/attribute list corresponding to the XML document in FIG. 9A; FIG. 9C is a diagram showing an example of a compressed state of the XML document in FIG. 9A; FIG. 9D is a diagram showing another example of the compressed state of the XML document in FIG. 9A;

FIG. 10 is a block diagram showing a structure of an essential part of a structured document compressing apparatus according to a fourth embodiment of this invention;

FIGS. 11A through 11C show examples of data according to the fourth embodiment; FIG. 11A is a diagram showing an example of a tag list; FIG. 11B is a diagram showing an example of an XML document having deficiency in its tag descriptions; FIG. 11C is a diagram showing a result of normalization of the XML document in FIG. 11B according to the tag list in FIG. 11A;

FIG. 12 is a block diagram showing an essential part of a modification of the structured document compressing apparatus according to the fourth embodiment of this invention;

FIG. 13 is a block diagram showing structures of a structured document compressing apparatus and a structured document decompressing apparatus according to a fifth embodiment of this invention;

FIGS. 14A and 14B show examples of data according to the fifth embodiment; FIG. 14A is a diagram showing an example of an XML document including a plurality of sub-documents; FIG. 14B is a diagram showing a compressed state of the XML document in FIG. 14A;

FIG. 15 is a diagram for illustrating a first example of a tag list collective managing method according to the embodiment;

FIG. 16 is a diagram for illustrating a second example of the tag list collective managing method according to the embodiment;

FIG. 17 is a diagram for illustrating a third example of the tag list collective managing method according to the embodiment;

FIG. 18 is a diagram showing an example of addition of tag-list identification information in the second and third examples of the tag list collective managing method according to the embodiment;

FIG. 19 is a diagram for illustrating general universal data compression; and

Figure 20:
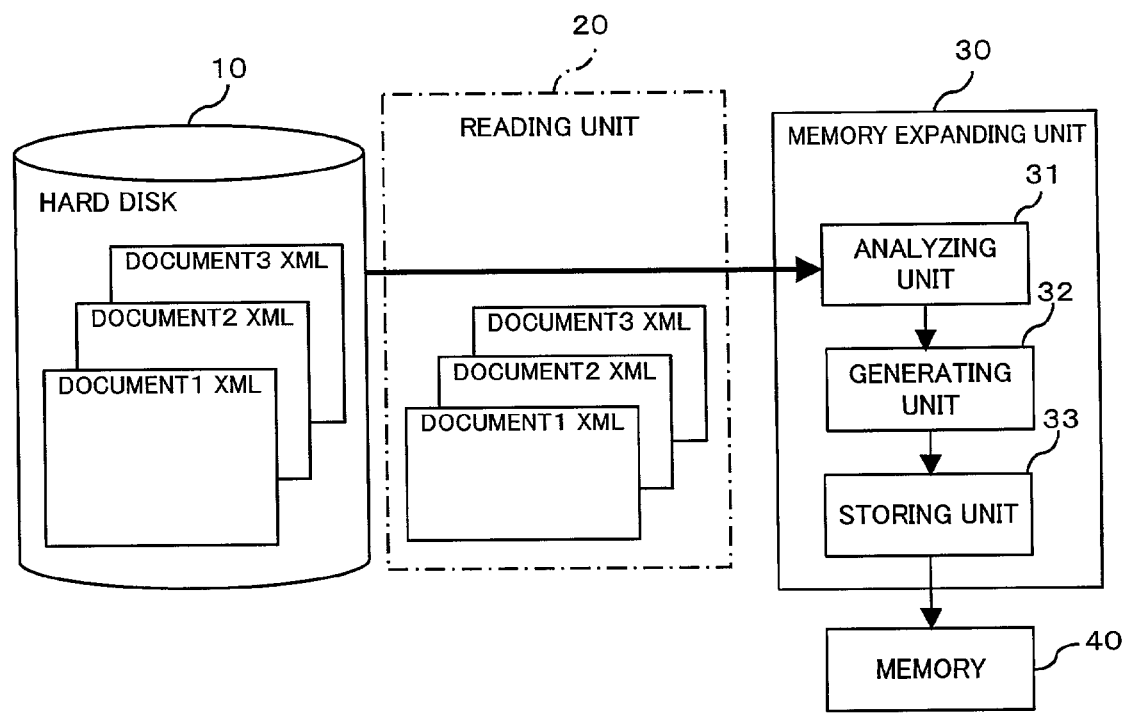

FIG. 20 is a block diagram showing an example of a structure of a general system handling XML documents.

DESCRIPTION OF THE PREFERRED EMBODIMENTS

Hereinafter, description will be made of embodiments of the invention with reference to the drawings.

[1] Description of First Embodiment

Figure 1:
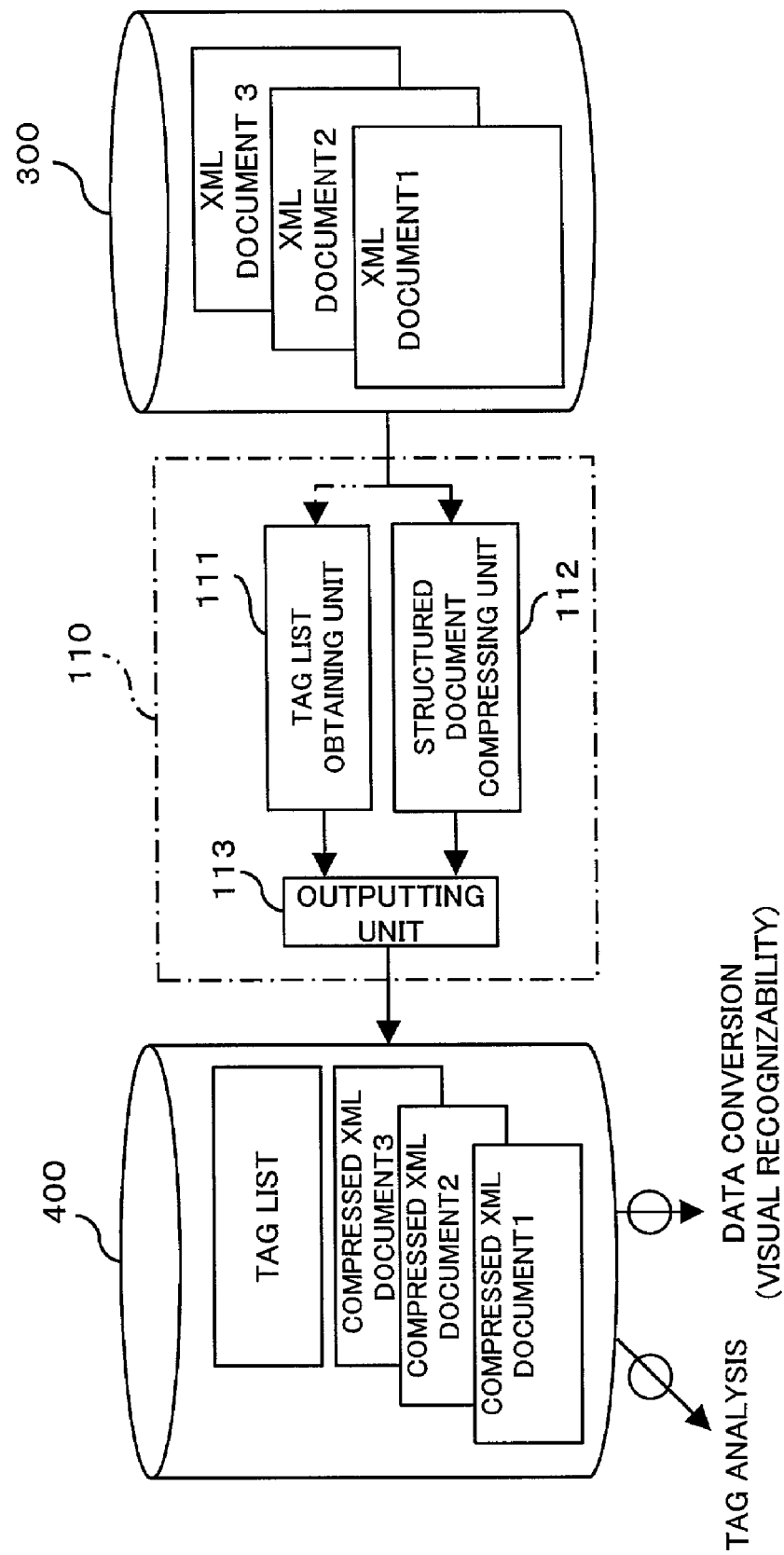
FIG. 1 is a block diagram showing a structure of a structured document compressing apparatus according to a first embodiment of this invention.
Figure 2:
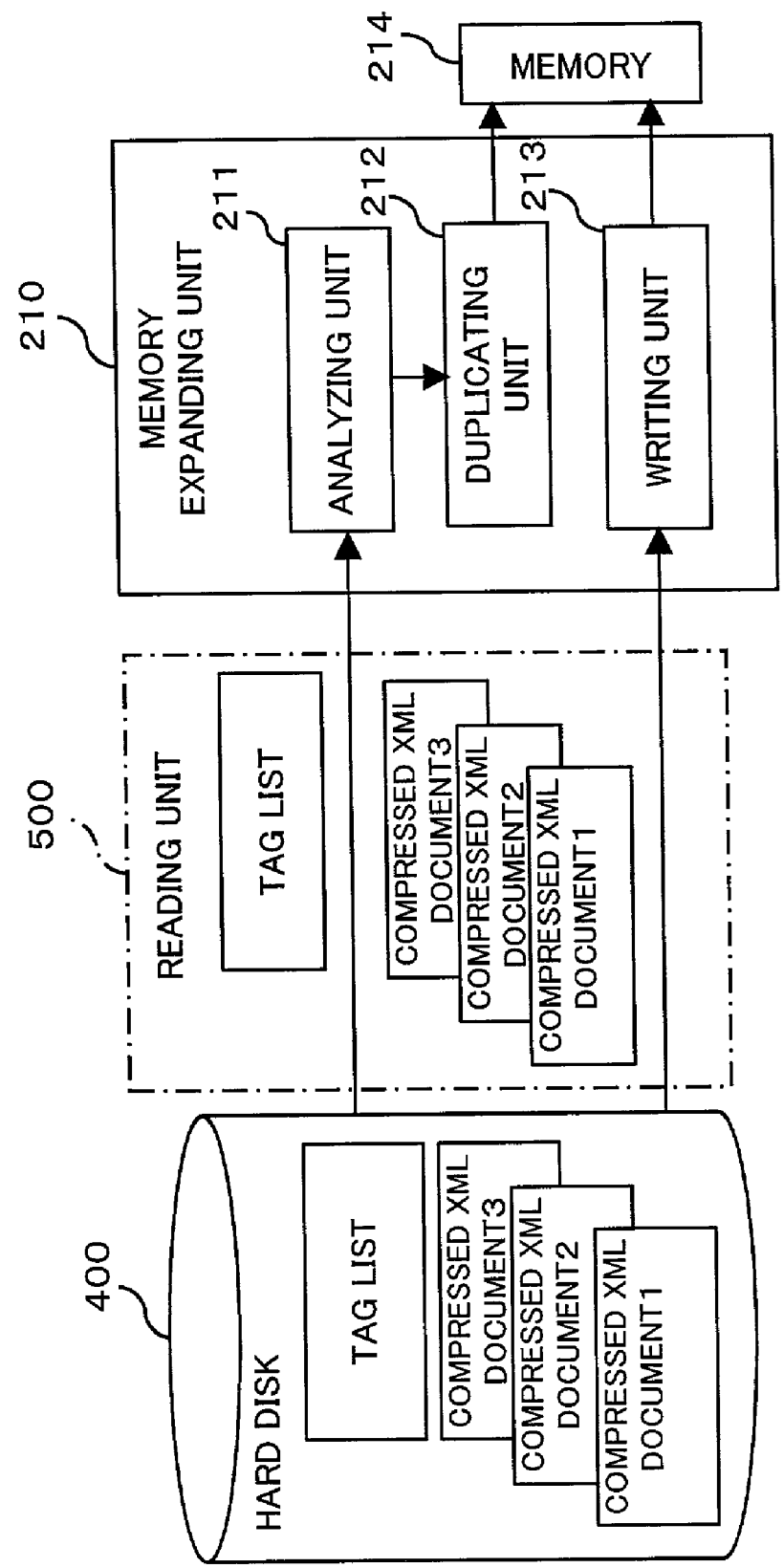
FIG. 2 is a block diagram showing a structure of a structured document decompressing apparatus (memory expanding unit) according to the first embodiment of this invention.

FIG. 1 is a block diagram showing a structure of a structured document compressing apparatus according to a first embodiment of this invention. FIG. 2 is a block diagram showing a structure of a structured document decompressing apparatus (memory expanding unit) according to the first embodiment of this invention.

The structured document compressing apparatus 110 shown in FIG. 1 and the memory expanding unit (structured document decompressing apparatus) 210 shown in FIG. 2 are included in a structured document processing system for processing a plurality of structured documents having a common data structure (document structure, tree structure), and configure a part of the structured document processing system.

Each of the embodiments will be hereinafter described by way of example where the structured document is in XML (extensible Markup Language), and a number of XML documents having a common data structure are handled, in particular. Processes to be executed by the structured document processing system are accumulation, manipulation, transfer, etc., of the XML documents. The XML documents that are objects of the processing are, for example, order slips, as will be described later with reference to FIG. 3A.

The structured document processing system is provided with the structured document compressing apparatus 110 for compressing XML documents in order to decrease an amount of storage needed for storing the XML documents and to speed up the above processes, and the memory expanding unit (structured document decompressing apparatus) 210 for decompressing/expanding the compressed data, which is compressed by the structured document compressing apparatus 110, on the memory 214.

The structured document compressing apparatus 110 according to the first embodiment comprises a tag list obtaining unit 111, a structured document compressing unit 112 and an outputting unit 113, as shown in FIG. 1. The memory expanding unit 210 according to the first embodiment comprises an analyzing unit 211, a duplicating unit 212 and a writing unit 213, as shown in FIG. 2.

The structured data compressing apparatus 110 and the memory expanding unit 210 are provided on one and the same computer or on respective different computers. Functions as the tag list obtaining unit 111, the structured document compressing unit 112 and the outputting unit 113 configuring the structured document compressing apparatus 110 are accomplished by executing a predetermined program (structured document compressing program) on the computer. Similarly, functions as the analyzing unit 211, the duplicating unit 212 and the writing unit 213 configuring the memory expanding unit 210 are accomplished by executing a predetermined program (structured document decompressing program) on the computer.

In FIG. 1, a hard disk (database) 300 beforehand stores and holds a plurality of XML documents (XML documents 1 to 3 in FIG. 1) to be compressed having a common data structure. A hard disk (database) 400 stores and holds results of compression by the structured document compressing apparatus 110. Incidentally, both of the XML documents to be compressed and results of compression by the structured document compressing apparatus 110 may be stored in one of the hard disks 300 and 400.

The tag list obtaining unit 111 obtains a single tag list common to the plural XML documents stored in the hard disk 300. In the tag list, tags that are extracted from the XML document in the order of appearance are listed, showing in which order the tags appear in the document (described later with reference to FIG. 3B) If generated from the plural XML documents having a common data structure, the tag lists are all identical ones.

The tab list obtaining unit 111 may obtain a tag list stored in, for example, a database (not shown), or may alternatively extract and generate a tag list from at least one of the plural XML documents stored in the hard disk 300.

The structured document compressing unit 112 generates compressed XML document compressed XML documents in each of which tags are replaced with predetermined delimiter codes. According to the first embodiment, "," is used as the predetermined delimiter code, as will be described later with reference to FIG. 3C.

The outputting unit 113 correlates a single tag list obtained by the tag list obtaining unit 111 with a plurality of compressed XML documents (compressed XML documents 1, 2, 3, of FIG. 1) generated from the respective plural XML documents by the structured document compressing unit 112, and outputs and stores them as results of compression of the plural XML documents in the hard disk 400.

In FIG. 2, the reading unit 500 reads the common tag list and the plural compressed XML documents stored in the hard disk 400 to the memory expanding unit 210. The memory expanding unit 210 comprises the analyzing unit 211, the duplicating unit 212 and the writing unit 213 in order to decompress and expand the plural compressed XML documents on the basis of the tag list on the memory 214.

The analyzing unit 211 analyzes the tag list read out from the hard disk 400 by the reading unit 500, and obtains, as a result of the analysis, a data structure common to the plural compressed XML documents that are objects of decompression and expansion.

The duplicating unit 212 expands and duplicates, on the memory 214, the data structure corresponding to the tag list obtained by the analyzing unit 211, as a duplicated data structure.

The writing unit 213 writes element contents of each of the compressed XML documents in predetermined regions of the duplicated data structure extended on the memory 214 while correlating a position of a tag in the duplicated data structure with a position of a delimiter code "," in each of the compressed XML documents.

Next, description will be made of operations of the structured document compressing apparatus 110 and the memory expanding unit 210 in the above structures according to the first embodiment.

In the structured document compressing apparatus 110 shown in FIG. 1, a data structure common to the plural XML documents is obtained as a single tag list by the tag list obtaining unit 111, and each of the XML documents is converted into a compressed XML document in which tags are replaced with delimiter codes "," in a tag compressing process by the structured document compressing unit 112.

After that, the tag list obtained by the tag list obtaining unit 111 and the plural compressed XML documents obtained by the structured document compressing unit 112 are outputted as results of compression with respect to the plural XML documents from the outputting unit 113, and stored in the hard disk 400. Namely, results of compression of the plural XML documents are outputted as a combination of a data structure (tag information) and data contents (information other than the tag information), according to the first embodiment. At that time, the data structure (tag information) is the single tag list described above, while the data contents are the plural compressed XML documents configured with delimiter codes and element contents.

At this time, the single tag list and each of the compressed XML documents are correlated in such a way as will be described later with reference to FIGS. 15 through 17. The single tag list representing a data structure common to the plural XML documents is shared by the plural compressed XML documents.

Next, description will be made of a practical compressed state of an XML document according to the first embodiment with reference to FIGS. 3A through 3C. FIGS. 3A through 3C are diagrams showing examples of data according to the first embodiment. FIG. 3A is a diagram showing an example of an XML document. FIG. 3B is a diagram showing a tag list obtained from the XML document shown in FIG. 3A. FIG. 3C is a diagram showing a state of the XML document of FIG. 3A being compressed.

FIG. 3A shows an example of an XML document before compressed, or to be compressed: an order slip described in XML. In the XML document shown in FIG. 3A, a data structure of the XML document (that is, a format of the order slip) is defined by start tags: <ORDER-SLIP>, <CUSTOMER>, <NAME>, <TELEPHONE-NUMBER>, <PRODUCT>, <MANUFACTURER>, <PRODUCT-NUMBER>, <PRODUCT-NAME>, and <PRICE>; and by end tags: </ORDER-SLIP>, </CUSTOMER>, </NAME>, </TELEPHONE-NUMBER>, </PRODUCT>, </MANUFACTURER>, </PRODUCT-NUMBER>, </PRODUCT-NAME>, and </PRICE>.

In the XML document shown in FIG. 3A, a name "STUV" of a customer is described, as an element, content between the start tag <NAME>; and the end tag </NAME>, a telephone number "1111" of the customer between the start tag <TELEPHONE-NUMBER> and the end tag </TELEPHONE-NUMBER>; a manufacturer "AAA company" of the product, between the start tag<MANUFACTURER> and the end tag </MANUFACTURER>, a product number "1234" of the product, between the start tag <PRODUCT-NUMBER> and the end tag </PRODUCT-NUMBER>; a product name "ABCD" of the product, between the start tag <PRODUCT-NAME> and the end tag </PRODUCT-NAME>; and a price "980" of the product, between the start tag<PRICE> and the end tag </PRICE>.

FIG. 3B shows a tag list of the XML document shown in FIG. 3A. The tag list has already been created in some way as described above, or is made by directly extracting the tags in the XML document of FIG. 3A by the tag list obtaining unit 111. In the example of FIG. 3B, the element contents "STUV", "1111", "AAA company", "ABCD", and "980" in the XML document of FIG. 3A are removed.

FIG. 3C shows a result of a tag compressing process performed on the XML document of FIG. 3A by the structured document compressing unit 112, that is, a compressed XML document in which tags in the XML document of FIG. 3A are replaced with a delimiter code ","

As being clear in comparison between FIGS. 3A through 3C, there is a one-to-one correspondence between the tags in the tag list and the delimiter codes "," in the compressed XML document, which delimiter codes are placed at the positions corresponding to the tags. Element contents in the XML document are described as they are in the compressed XML document. Accordingly, the compressed XML document according to the first embodiment can be given any data structure, like the original XML documents, without impairing the visual recongnizability because of its being described in text.

In the memory expanding unit 210 shown in FIG. 2, the tag list correlated with the compressed XML documents that are objects of decompression and expansion is read out from the hard disk 400 by the reading unit 500, and inputted to the analyzing unit 211. The analyzing unit 211 analyzes the inputted tag list to obtain a data structure common to a plurality of compressed XML documents that are objects of decompression and expansion. The duplicating unit 212 expands and duplicates the data structure, obtained by the analyzing unit 211 for each of the compressed XML documents, on the memory 214.

After that, the element contents in each of the compressed XML documents are written in predetermined regions in the reproduced data structure on the memory 214 while positions of the tag in the reproduced data structure and positions of the delimiter codes "," in each of the compressed XML documents are correlated, respectively. Whereby each of the compressed XML documents (each of the structured documents) is expanded on the memory 214 at decompression.

In the first embodiment of this invention, the tags that are embedded in the original document are replaced with the delimiter code ",", with no changes in data contents (element contents), in the compressed XML documents generated by the structured document compressing unit 112. It is thereby possible to compress the XML documents to decrease a data quantity of the XML documents, without impairing visual recognizability or flexibility/expandability of the data structure, which is a part of the advantages of XML documents (structured documents).

Accordingly, it is possible to decrease an amount of storage area required to store XML documents (compressed XML documents), enabling an effective use of the storage area of a record medium (the hard disk 400 in this embodiment) storing the compressed XML documents, and to increase a transmission speed of the XML document data.

Due to a combination of a data structure (a single tag list) and data contents (plural compressed XML documents) output as the result of the compression of the plural XML documents, the analyzing process is performed on a single tag list, only once, by the analyzing unit 211 in the memory expanding unit 210 according to the first embodiment, to obtain a data structure common to the plural compressed XML documents. After that, the duplicating unit 212 duplicates the obtained data structure to be used for the other compressed XML documents. Inconsequence, it is unnecessary to execute the tag analysis for each of the compressed XML documents.

As above, it is unnecessary to perform wasteful tag analysis by the analyzing unit 211 in the memory expanding unit 210 when a number of XML documents having a common data structure are handled, which allows to decrease a load of the tag analysis, and considerably increase the speed at which the XML documents are expanded on the memory 214.

[2] Description of Second Embodiment

FIG. 4 is a block diagram showing a structure of a structured document compressing apparatus according to a second embodiment of this invention. FIG. 5 is a block diagram showing a structure of a structured document decompressing apparatus according to the second embodiment of this invention.

The structured document compressing apparatus 120 shown in FIG. 4 and the structured document decompressing apparatus 220 shown in FIG. 5 are included in a structured document processing system for processing XML documents forming part of the structured document processing system.

The structured document compressing apparatus 120 according to the second embodiment is to compress XML documents, which apparatus 120 comprises an inputting unit 121, a tag detecting unit 122, a tag replacement unit 123 and an outputting unit 124, as shown in FIG. 4. Incidentally, the structured document compressing apparatus 120 can be used as the structured document compressing unit 112 according to the first embodiment.

The structured document decompressing apparatus 220 according to the second embodiment decompresses the compressed XML documents (compressed data) generated by the structured document compressing apparatus 120, reconstructing the original XML documents. The structured document decompressing apparatus 220 comprises an inputting unit 221, a tag list holding unit 222, a delimiter code detecting unit 223, a tag restoring unit 224 and an outputting unit 225, as shown in FIG. 5.

The structured document compressing apparatus 120 and the structured document decompressing apparatus 220 are provided on one and the same computer, or on respective different computers. Functions as the inputting unit 121, the tag detecting unit 122, the tag replacement unit 123, and the outputting unit 124, configuring the structured document compressing apparatus 120 are accomplished by executing a predetermined program (structured document compressing program) on the computer. Similarly, functions as the inputting unit 221, the delimiter code detecting unit 223, the tag restoring unit 224, and the outputting unit 225, configuring the structured document decompressing apparatus 220 are accomplished by executing a predetermined program (structured document decompressing program) on the computer.

In the structured document compressing apparatus 120 shown in FIG. 4, the inputting unit 121 captures an XML document to be compressed from a hard disk or the like (reference character 300 in FIG. 1, for example). The tag detecting unit 122 detects tags in the XML document captured by the input unit 121.

The tag replacement unit 123 replaces each of the tags detected by the tag detecting unit 122 with a predetermined delimiter code. According to the second embodiment, a predetermined delimiter code ",", like in the first embodiment, replaces the tags (described later with reference to FIG. 6C). Alternatively, two types of delimiter codes "," and "/" may replace a start tag and an end tag, respectively (described later with reference to FIG. 6D).

The outputting unit 124 outputs a compressed XML document, generated by the tag replacement unit 123, to a hard disk (refer to reference characters 400, 410, 420, 440 in FIGS.

1, 2 and 15 through 17, for example) or the like, as a result of compression, and stores the compressed XML document therein.

In the structured document decompressing apparatus 220 shown in FIG. 5, the inputting unit 221 captures the compressed XML document stored in a record medium (hard disk 400, 410, 420 or 440 shown in FIG. 1, 2, 15, 16 or 17, for example), or the like, for decompression.

The tag list holding unit 222 holds a tag list (refer to FIG. 6B, for example) in which tags are listed in the order of appearance in the XML document. The tag list holding unit 222 obtains/stores a tag list that is generated and stored in advance in the database (not shown) or the like.

It is assumed, in the second embodiment like the first embodiment, that a plurality of XML documents that are objects of the processing have a common data structure. The tag list is shared by the plural XML documents, indicating which tags appear in what order in each of the plural XML documents, as described above in the first embodiment.

The delimiter code detecting unit 223 detects delimiter codes in the compressed XML documents captured by the input unit 221.

The tag restoring unit 224 replaces a delimiter code with a corresponding tag in the tag list, thereby restoring the original tag, while correlating a position of the tag in the tag list held in the tag list holding unit 222 with a position of the delimiter code detected by the delimiter code detecting unit 223.

The outputting unit 225 outputs, to a record medium (hard disk 300 in FIG. 1, for example) or the like, an XML document decompressed by the tag restoring unit 224 as a result of decompression and stores it therein.

Next, description will be made of operations of the structured document compressing apparatus 120 and the structured document decompressing apparatus 220 in the above structures according to the second embodiment.

In the structured document compressing apparatus 120 shown in FIG. 4, the inputting unit 121 captures an XML document that is an object of compression, and the tag detecting unit 122 searches for tags in the XML document. Parts other than the tags (that is, element contents) are sent as they are to the outputting unit 124. When the tag detecting unit 122 detects a tag, the tag replacement unit 123 replaces the tag with a predetermined delimiter code, which is then sent to the outputting unit 124. A compressed XML document generated in such a simple replacing process is outputted as a result of compression from the outputting unit 124.

Here, a practical compressed state of an XML document according to the second embodiment will be described with reference to FIGS. 6A through 6D. FIGS. 6A through 6C show typical data according to the second embodiment. FIG. 6A is a diagram showing an example of an XML document. FIG. 6B is a diagram showing a tag list corresponding to the XML document of FIG. 6A. FIG. 6C is a diagram showing an example of a compressed state of the XML document of FIG. 6A. FIG. 6D is a diagram showing another example of the compressed state of the XML document of FIG. 6A.

FIG. 6A shows an example of an XML document before compressed, or an XML document to be compressed: an order slip described in XML. In particular, FIG. 6A shows a part (descriptions relating to a manufacturer, a product number, and a price of a product) extracted from the order slip described above with reference to FIG. 3A.

FIG. 6B shows a tag list of the XML document shown in FIG. 6A. Such a tag list is beforehand extracted and generated in some way, and stored in the tag list holding unit 222 in the structured document decompressing apparatus 220. In the tag list shown in FIG. 6B, parentheses ("<" and ">") attached before and after a tag are omitted.

FIG. 6C shows a result of a tag compressing process on the XML document shown in FIG. 6A by the tag replacement unit 123, that is, a compressed XML document in which tags in the XML document shown in FIG. 6A are replaced with delimiter codes ",".

FIG. 6D shows a result of another compression of the same XML document. Namely, in the compressed XML document shown in FIG. 6D, start tags in the XML document are replaced with "," while end tags are replaced with "/".

Being clear in comparison between FIGS. 6A through 6D, there is a one-to-one correspondence between the tags in the tag list and the delimiter codes "," and "/" in the compressed XML document, which delimiter codes are placed at the positions corresponding to the tags. Element contents in the compressed XML document are described as they are in the original XML document.

The compressed XML document according to the second embodiment can be given any data structure like the original XML documents, without impairing visual recognizability of the element contents. Particularly, in the XML compressed XML document shown in FIG. 6D, two types of delimiter codes, "," and "/", replaces a start tag and an end tag, respectively, so that the positions of the start tag and end tag are visually recognizable.

In the structured document decompressing apparatus 220 shown in FIG. 5, the inputting unit 221 captures a compressed XML document that is an object of decompression as shown in, for example, FIG. 6C or 6D, and the delimiter code detecting unit 223 searches for delimiter codes ("," or "," and "/") in the compressed XML document.

Parts (i.e., element contents) other than the delimiter codes are sent to the outputting unit 225 without making any changes. When the delimiter code detecting unit 223 detects a delimiter code, the delimiter code is replaced with a tag corresponding to the delimiter code by the tag restoring unit 224, then sent to the outputting unit 225. An XML document as shown in, for example, FIG. 6A is decompressed in such the simple replacing process, and outputted from the outputting unit 225.

When the tag restoring unit 224 performs the replacing process, a position of a tag in the tag list held in the tag list holding unit 222 is correlated with a position of the delimiter code detected by the delimiter code detecting unit 223. Whereby, it is detected which tag in the tag list the detected delimiter code corresponds to, and the delimiter code can be thereby replaced with a proper tag (a corresponding tag). In this manner, the compressed XML document is decompressed into the original XML document.

The structured document compressing apparatus 120 according to the second embodiment of this invention compresses an XML document in the simple replacing process of replacing tags detected in the XML document with predetermined delimiter codes, without impairing the visual recognizability of a data structure or flexibility/expandability, which are a part of the advantages of the XML documents, thereby decreasing a data quantity of the XML document.

According to the second embodiment, it is possible to decrease an amount of a storage area used to store XML documents (compressed XML documents), enabling an effective use of a record medium (hard disk 400, 410, 420 and 440 shown in FIGS. 1, 2 and 15 through 17, for example) to store the XML documents, also increasing a transmission speed of the XML document data, like the first embodiment.

The structured document decompressing apparatus 220 according to the second embodiment can readily decompress a compressed XML document into the original XML document in the simple replacing process, such as, of replacing delimiter codes detected in the compressed XML document with predetermined tags while correlating the delimiter codes with the tags in the tag list for the compressed XML documents.

[3] Description of Third Embodiment

FIG. 7 is a block diagram showing a structure of a structured document compressing apparatus according to a third embodiment of this invention. FIG. 8 is a block diagram showing a structure of a structured document decompressing apparatus according to the third embodiment of this invention. Incidentally, like reference characters in the drawings designate like or corresponding parts, detailed descriptions of which are thus omitted.

The structured document compressing apparatus 130 shown in FIG. 7 and the structured document decompressing apparatus 230 shown in FIG. 8 are included in a structured document processing system for processing XML documents like the second embodiment, configuring apart of the structured document processing system. The structured document compressing apparatus 130 and the structured document decompressing apparatus 230 are configured similarly to the structured document compressing apparatus 120 shown in FIG. 4 and the structured document decompressing apparatus 220 shown in FIG. 5, respectively.

When an attribute is described in a tag in an XML document, the structured document compressing apparatus 130 according to the third embodiment can compress the XML document, without impairing the visual recognizability of the attribute, leaving the attribute still recognizable even after compression. As shown in FIG. 7, the structured document compressing apparatus 130 comprises an attribute-bearing-tag discriminating unit 131 and an attribute-bearing-tag replacement unit 132, along with an inputting unit 121, a tag detecting unit 122, a tag replacement unit 123, and an outputting unit 124, similar to those in the second embodiment. The structured document compressing apparatus 130 can be used as the structured document compressing unit 112 according to the first embodiment.

The structured document decompressing apparatus 230 according to the third embodiment decompresses a compressed XML document (compressed data), generated by the structured document compressing apparatus 130, into the XML document. The structured document decompressing apparatus 230 comprises, as shown in FIG. 8, an attribute list holding unit 231, an attribute-bearing-tag discriminating unit 232 and an attribute-bearing-tag restoring unit 233, along with an inputting unit 221, a tag list holding unit 222, a delimiter code detecting unit 223, a tag restoring unit 224 and an outputting unit 225 similar to those in the second embodiment.

The structured document compressing apparatus 130 and the structured document decompressing apparatus 230 according to the third embodiment are provided on one and the same computer, or on respective different computers. Functions as the inputting unit 121, the tag detecting unit 122, the tag replacement unit 123, the outputting unit 124, the attribute-bearing-tag discriminating unit 131, and the attribute-bearing-tag replacement unit 132, configuring the structured document compressing apparatus 130, are accomplished by executing a predetermined program (structured document compressing program) on the computer. Similarly, functions as the inputting unit 221, the delimiter code detecting unit 223, the tag restoring unit 224, the outputting unit 225, the attribute-bearing-tag discriminating unit 232, and the attribute-bearing-tag restoring unit 233, configuring the structured document decompressing apparatus 230, are accomplished by executing a predetermined program (structured document decompressing program) on the computer.

In the structured document compressing apparatus 130 shown in FIG. 7, the attribute-bearing-tag discriminating unit 131 is included in the tag detecting unit 122 to discriminate whether or not a tag detected by the tag detecting unit 122 is an attribute-bearing tag having an attribute value. An attribute-bearing tag is a tag in which additive information (attribute) is inserted. The attribute is described in such a manner that, in a start tag, a space is put after an element name followed by a description, "attribute-name='attribute-value'" (concretely described later with reference to FIG. 9A). Namely, an attribute-bearing tag is generally described as "<element-name_attribute-name='attribute-value'>" ("_" means a space, and hereinafter the same way of description will be used).

The attribute-bearing-tag replacement unit 132 replaces an attribute-bearing tag detected by the attribute-bearing-tag discriminating unit 131 with a set of an attribute value and predetermined delimiter codes. As a delimiter code to be replaced by the attribute-bearing-tag replacement unit 132, "," or "=" is used, as will be described later with reference to, for example, FIG. 9C or 9D.

When the attribute-bearing-tag replacement unit 132 replaces an attribute-bearing tag with an attribute value and delimiter codes, the delimiter code is arranged before and after the attribute value, according to this embodiment (refer to FIG. 9C or 9D). For instance, "<element-name_attribute-name='attribute-value'>" is replaced with a compressed description such as ", attribute-value," or", attribute-value=". A tag having plural attributes, described as "<element-name_attribute-name-1='attribute-value-1' a ttribute-name-2='attribute-value-2'>" is replaced with a compressed description as ", attribute-value-1,attribute-value-2," or ", attribute-value-1=attribute-value-2=".

The outputting unit 124 according to the third embodiment outputs a compressed XML document generated by the tag replacement unit 123 and the attribute-bearing-tag replacement unit 132, as a result of compression, to a hard disk or the like (refer to reference characters 400, 410, 420 and 440 in FIGS. 1, 2, and 15 through 17), and stores the compressed XML document therein.

In the structured document decompressing apparatus 230 shown in FIG. 8, the attribute list holding unit 231 holds an attribute list in which attribute names are listed in the order of appearance in the compressed XML document. The attribute list holding unit 231 obtains the attribute list, which is generated in advance, from a database (now shown) or the like, and stores it.

The attribute list according to the third embodiment is practically given in such a form as being included in the tag list, as will be described later with reference to FIG. 9B. For this, the attribute list holding unit 231 is included in the tag list holding unit 222 in FIG. 8. Hereinafter, the tag list that includes the attribute list will be occasionally referred to as a tag/attribute list. In such the tag/attribute list, when a character string described in the list is an attribute name, a code "=", for example, is added before (on the left side of) the character string in order to make it clearly seen, as shown in FIG. 9B, for example.

Assuming in the third embodiment like the first embodiment that a plurality of XML documents that are objects of the processing have a common data structure. The tag list and the attribute list (tag/attribute list) are shared by the plural XML documents, and represent in which order tags appear, or in which order attributes appear in each of the XML documents.

The attribute-bearing-tag discriminating unit 232, which is included in the tag detecting unit 224, discriminates whether or not a given original tag to be restored by the tag restoring unit 224 is an attribute-bearing tag. At this time, the attribute-bearing-tag discriminating unit 232 recognizes a state of arrangement of delimiter codes or a type of the delimiter codes, or refers to and recognizes the correspondence between an attribute value in the compressed XML document with an attribute name in the tag/attribute list, thereby discriminating whether or not the given original tag to be restored is an attribute-bearing tag, that is, whether or not the tag has an attribute.

The attribute-bearing-tag restoring unit 233 restores the tag, which is detected by the attribute-bearing-tag discriminating unit 232 to be restored, as an attribute-bearing tag, which has the tag-corresponded attribute. According to third embodiment, a part, corresponding to an attribute-bearing tag, of a compressed XML document is reconstructed, as a normal tag "<element-name>" including only an element name, by the tag restoring unit 224. The attribute-bearing-tag restoring unit 233 according to the third embodiment correlates an attribute value of the attribute-bearing tag with an attribute name in the attribute list to restore the attribute in the attribute-bearing tag.

More concretely, the attribute-bearing-tag restoring unit 233 reads an attribute name, corresponding to an attribute to be restored, from the attribute list (tag/attribute list), and replaces delimiter codes, corresponding to the to-be-restored attribute and also to data (attribute value) combined with those delimiter codes, with a normal attribute description, thereby restoring the original attribute in the tag reconstructed by the tag restoring unit 224, thus making the attribute-bearing tag restored. For instance, a compressed description of an attribute such as "attribute-value," or "attribute-value=" is replaced with "attribute-name='attribute-value'", and a compressed description of an attribute such as "attribute-value-1,attribute-value-2," or "attribute-value-1=attribute-value-2=" is replaced with "attribute-name-1='attribute-value-1' attribute-name-2='attribute-value-2'".

The outputting unit 225 according to the third embodiment outputs an XML document decompressed by the tag restoring unit 224 and the attribute-bearing-tag restoring unit 233, as a result of decompression, to the record medium (hard disk 300 in FIG. 1, for example) and stores the XML document therein.

Next, description will be made of operations of the structured document compressing apparatus 130 and the structured document decompressing apparatus 230 in the above structures according to the third embodiment.

In the structured document compressing apparatus 130 shown in FIG. 7, an XML document that is an object of compression is captured by the inputting unit 121, and tags in the XML document are searched for by the tag detecting unit 122. Parts other than the tags are sent as they are to the outputting unit 124. When a tag is detected by the tag detecting unit 122, the attribute-bearing-tag discriminating unit 131 discriminates whether or not the tag is an attribute-bearing tag.

When the tag is not an attribute-bearing tag, the tag is replaced with a predetermined delimiter code by the tag replacement unit 123, and sent to the outputting unit 124.

When the tag is an attribute-bearing tag, the tag is replaced with an attribute value described in the tag and with predetermined delimiter codes, by the attribute-bearing-tag replacement unit 132, and sent to the outputting unit 124.

According to the third embodiment, when the XML document involves an attribute-bearing tag, a compressed XML document in which an attribute value is left as it is along with an element content, is generated in the above simple replacing process, and outputted as a result of compression from the outputting unit 124.

Here, a practical compressed XML document according to the third embodiment will be described with reference to FIGS. 9A through 9D. FIGS. 9A through 9D show typical data according to the third embodiment. FIG. 9A is a diagram showing an example of an XML document. FIG. 9B is a diagram showing a tag/attribute list corresponding to the XML document in FIG. 9A. FIG. 9C is a diagram showing an example of a compressed state of the XML document shown in FIG. 9A. FIG. 9D is a diagram showing another example of the compressed state of the XML document shown in FIG. 9A.

FIG. 9A shows a case where an order slip is described in XML, as an example of an XML document before compression, that is, an XML document that is an object of compression. Particularly, FIG. 9A shows a part extracted from an order slip similar to that shown in FIG. 6A. In the example shown in FIG. 9A, a start tag given a product number as an element name bears an attribute. Namely, "PRODUCT-NAME='ABCD'COLOR='BLUE'" is described as an attribute in the start tag (attribute-bearing tag). Here, "PRODUCT-NAME" and "COLOR" are attribute names, and "ABCD" and "BLUE" are attribute values.

FIG. 9B shows a tag/attribute list for the XML document shown in FIG. 9A. Such a tag/attribute list is beforehand extracted and generated by in some way, and stored in the tag list holding unit 222 and in the attribute list holding unit 231 both in the structured document decompressing apparatus 230. In the tag/attribute list shown in FIG. 9B, items relating to an attribute names of the product number, that is, "=PRODUCT-NAME" and "=COLOR" are further added to the tag list shown in FIG. 6B.

FIG. 9C shows a result of compression of the XML document shown in FIG. 9A by the 123 and the attribute-bearing-tag replacement unit 132, that is, a compressed XML document in which tags are replaced with a delimiter code "," and an attribute is replaced with "attribute-value," in the XML document shown in FIG. 9A. Namely, an attribute-bearing tag, "<PRODUCT-NUMBER_PRODUCT-NAME='ABCD'COLOR='BLUE'>" in FIG. 9A is replaced with ",ABCD,BLUE," in the compressed XML document in FIG. 9C.

FIG. 9D shows another result of compression of the same XML document. Namely, in the compressed XML document shown in FIG. 9D, start tags are replaced with "," while end tags are replaced with "/" in the tag compressing process by the tag replacement unit 123, and "," is used as a delimiter code to be added to an attribute value in the replacement process by the attribute-bearing-tag replacement unit 132. Therefore, an attribute-bearing tag "<PRODUCT-NUMBER_PRODUCT-NAME='ABCD'COLOR='BLUE'>" in FIG. 9A is replaced with ",ABCD=BLUE=" in the compressed XML document in FIG. 9D.

Being clear in comparison between FIGS. 9A through 9D, there is a one-to-one correspondence between the tags in the tag/attribute list and the delimiter codes "," and "/" in the compressed XML document, which delimiter codes are placed at the positions corresponding to the tags. An element content in the XML document is described as it is in the compressed XML document. Further, an attribute value in the XML document is described as it is, with the delimiter code "," or "/" being added to the right side thereof, in the compressed XML document.

Consequently, the compressed XML document according to the third embodiment can be given any data structure, like the original XML documents, without impairing the visual recognizability of not only an element content but also of an attribute value. Particularly, in the compressed XML document shown in FIG. 9D, three types of delimiter codes "," and "/" and "=" replace a start tag, an end tag, and an attribute, respectively. Therefore, positions of the start tag, the end tag and the attribute are visually recognizable.

In the structured document decompressing apparatus 230 shown in FIG. 8, a compressed XML document that is an object of decompression as shown in, for example, FIG. 9C or FIG. 9D is captured by the inputting unit 221, and delimiter codes ("," and/or "/") in the compressed XML document are searched for by the delimiter code detecting unit 223.

Parts other than delimiter codes and attribute values (that is, element contents) are sent as they are to the outputting unit 225. When the delimiter code detecting unit 223 detects a delimiter code, the tag restoring unit 224 replaces the delimiter code with a tag corresponding to the delimiter code. In the replacing process by the tag restoring unit 224, a position of a tag in the tag list held in the tag list holding unit 222 is correlated with a position of the delimiter code detected by the delimiter code detecting unit 223, whereby it is recognized which tag in the tag list the detected delimiter code corresponds to. The delimiter code can be thus replaced with a proper tag (a corresponding tag).

According to the third embodiment, the attribute-bearing-tag discriminating unit 232 discriminates whether or not a given tag to be restored by the tag restoring unit 224 has an attribute. When it is recognized that the tag does not have an attribute, the tag (without an attribute) restored by the tag restoring unit 224 is outputted to the outputting unit 225.

When it is recognized that the tag has an attribute, an attribute corresponding to the tag is restored by the attribute-bearing-tag restoring unit 233 in a normal tag (for example, "<PRODUCT-NUMBER>"), which contains only an element-name, restored by the tag restoring unit 224, and is sent to the outputting unit 225.

For instance, with respect to a compressed description ",ABCD,BLUE," or ",ABCD=BLUE=" shown in FIG. 9C or 9D, the first delimiter code "," in the compressed description is detected, then it is recognized that the delimiter code corresponds to "PRODUCT-NUMBER". Further, by referring to the tag/attribute list shown in FIG. 9B, it is recognized that a tag corresponding to the above compressed description has two attributes whose attribute names are "PRODUCT-NAME" and "COLOR". According to recognition of such the attribute information, the attribute-bearing-tag restoring unit 233 converts and decompresses the above compressed description into an attribute-bearing-tag "<PRODUCT-NUMBER_PRODUCT-NAME='ABCD'COLOR='BLUE'>" as shown in FIG. 9A.

The structured document compressing apparatus 130 according to the third embodiment of this invention provides the similar functions and effects to those provided by the structured document compressing apparatus 120 according to the second embodiment. Additionally, when a tag is an attribute-bearing tag having an attribute, the attribute-bearing tag is replaced with an attribute value and predetermined delimiter codes to be compressed. As this, an attribute value is described in the compressed XML document as it is in the original XML document, so that the XML document can be compressed without impairing the visual recognizability of not only an element content but also of an attribute value.

The structured document decompressing apparatus 230 according to the third embodiment provides the similar functions and effects to those provided by the structured document decompressing apparatus 220 according to the second embodiment. Additionally, when a compressed attribute-bearing tag as above becomes an object of decompression, the attribute-bearing tag can be decompressed very easily, correlating an attribute value of the attribute-bearing tag with an attribute name in the tag/attribute list for the compressed XML document.

[4] Description of Fourth Embodiment

FIG. 10 is a block diagram showing a structure of essential parts of a structured document compressing apparatus according to a fourth embodiment of this invention.

The structured document compressing apparatus 140 shown in FIG. 10 has an inputting unit 141, a tag list holding unit 142, a tag rearranging unit 143, and an omitted-tag supplementing unit 144, prior to the structured document compressing apparatus 120 shown in FIG. 4. Incidentally, the structured document compressing apparatus 140 can be used as the structured document compressing unit 112 according to the first embodiment. The inputting unit 141, the tag rearranging unit 143, and the omitted-tag supplementing unit 144, configuring the essential part of the structured document compressing apparatus 140, are realized by executing a predetermined program (structured document compressing program) on the computer.

In the structured document compressing apparatus 140 shown in FIG. 10, the inputting unit 141 captures a to-be-decompressed XML document stored in a hard disk or the like (refer to reference character 300 in FIG. 1, for example).

The tag list holding unit 142 beforehand holds a tag list in which tags are arranged in a predetermined order in order to define a predetermined data structure. In more detail, it is assumed in the fourth embodiment that a plurality of XML documents to be compressed have a common data structure, like the first and second embodiments. The tag list held in the tag list holding unit 142 is shared by the plural XML documents, and represents in which order tags appear in each of the XML documents, like the tag list held in the tag list holding unit 222 of the structured document decompressing apparatus 220. At that time, the tag list holding unit 142 obtains/stores a tag list that is generated from an XML document to be compressed and stored in a database (not shown) or the like.

The tag rearranging unit 143 compares the inputted XML document with the tag list, and rearranges tags in the XML document before compressed in such a manner that the order in which tags are described in the XML document matches the order in which the tags are arranged in the tag list (a predetermined order). When the order of appearance of a start tag and an end tag, being paired, is changed, the tag rearranging unit 143 also moves a corresponding element content described between the start tag and the end tag.

The omitted-tag supplementing unit 144 supplements a tag omitted in the XML document processed by the tag rearranging unit 143 according to the tag list held in the tag list holding unit 142. Namely, the omitted-tag supplementing unit 144 compares the inputted XML document with the tag list. Upon detection of a tag missing from the XML document, the omitted-tag supplementing unit 144 reads a tag corresponding to the missing tag from the tag list, and supplements the missing tag. At that time, if a start tag and an end tag, being paired, are supplemented, the omitted-tag supplementing unit 144 leaves an element content, described between the start tag and the end tag, empty.

The XML document processed by the tag rearranging unit 143 and by the omitted-tag supplementing unit 144 is inputted to the structured document compressing apparatus 120 according to the second embodiment.

Next, description will be made of an operation of the structured document compressing apparatus 140 in the above structure according to the fourth embodiment.

In the structured document compressing apparatus 140 shown in FIG. 10, the inputting unit 141 captures an XML document that is an object of compression, and the tag rearranging unit 143 compares the XML document with the tag list. When there is any deficiency such as reversal in the order of description of tags in the XML document, the tag rearranging unit 143 rearranges the tags in the XML document before compressed such that the order of description of the tags in the XML document is matched with the order of arrangement of tags in the tag list.

The XML document undergone the rearranging process is inputted to the omitted-tag supplementing unit 144. The omitted-tag supplementing unit 144 compares the XML document with the tag list. Upon detection of a tag missing from the XML document, the omitted-tag supplementing unit 144 reads a tag corresponding to the missing tag from the tag list, and supplements the missing tag.

Now, a practical compressed state of the XML document according to the fourth embodiment will be described with reference to FIGS. 11A through 11C. FIGS. 11A through 11C show examples of data according to the fourth embodiment. FIG. 11A is a diagram showing an example of a tag list. FIG. 11B is a diagram showing an example of an XML document in which deficiency exists in descriptions of tags. FIG. 11C is a diagram showing a result of normalization of the XML document of FIG. 111B according to the tag list shown in FIG. 11A.

FIG. 11A shows the same tag list as that shown in FIG. 6B. Here is described a case where the tag rearranging unit 143 and the omitted-tag supplementing unit 144 process an XML document according to the tag list shown in FIG. 1A. The XML document that is an object of the processing is one shown in FIG. 11B, for example.

The tag rearranging unit 143 compares the tag list in FIG. 11A with the XML document in FIG. 11B. It is thereby recognized that the tags and the element content "300" relating to a price and the tags and the element content "B7" relating to a product number are in reversed order in the XML document in FIG. 11B, so that they are rearranged so as to be in order.

The omitted-tag supplementing unit 144 then compares the XML document undergone the rearrangement with the tag list in FIG. 11A, thereby recognizing that the tags relating to a manufacturer are missing in the XML document. The omitted-tag supplementing unit 144 supplements a start tag and an end tag relating to a manufacturer, with an empty element content between them.

As a result, the deficiency is corrected in the descriptions of the tags in the XML document as shown in FIG. 11B, thereby providing the XML document with a data structure matching the tag list of FIG. 11A, thus normalizing (rearranging) the XML document as shown in FIG. 11C.

Namely, the processing by the tag rearranging unit 143 and by the omitted-tag supplementing unit 144 are performed on all the XML documents that are to be compressed by the structured document compressing apparatus 120, whereby all the XML documents are normalized so as to have a data structure matching the tag list.

The XML document normalized as above is inputted to the structured document compressing apparatus 120, and compressed as described above in the second embodiment. The XML document, now being free from deficiencies, passes through the tag rearranging unit 143 and the omitted-tag supplementing unit 144, and is then inputted to the structured document compressing apparatus 120.

FIG. 12 is a block diagram showing a structure of an essential part of modification of the structured document compressing apparatus according to the fourth embodiment of this invention.

The structured document compressing apparatus 150 shown in FIG. 12 has an inputting unit 151, a tag/attribute list holding unit 152, a tag/attribute rearranging unit 153, and an omitted tag/attribute supplementing unit 154, prior to the structured document compressing apparatus 130 shown in FIG. 7. Incidentally, the structured document compressing apparatus 150 may be used as the structured document compressing unit 112 according to the first embodiment. The inputting unit 151, the tag/attribute rearranging unit 153, and the omitted tag/attribute supplementing unit 154, configuring the essential part of the structured document compressing apparatus 150, are realized by executing a predetermined program (structured document compressing program) on the computer.

In the structured document compressing apparatus 150 shown in FIG. 12, the inputting unit 151 captures a to-be-compressed XML document including an attribute-bearing tag stored in a hard disk or the like (refer to reference character 300 in FIG. 1, for example).

The tag/attribute list holding unit 152 holds a tag/attribute list listing tags and attribute names in a predetermined order in order to define a predetermined data structure. In more detail, assuming, in the modification of the fourth embodiment, that a plurality of XML documents to be processed have a common data structure, like the first to third embodiments, the tag/attribute list held in the tag/attribute list holding unit 152 is shared by the plural XML documents like the tag/attribute list of the structured document compressing apparatus 230, and indicates which tag appears in what order, or which attribute appears in what order, in each of the XML documents. The tag/attribute list holding unit 152 obtains/stores a tag/attribute list that is generated in advance with respect to a to-be-compressed XML document and is stored in a database (not shown) or the like.

The tag/attribute rearranging unit 153 compares the inputted XML document with the tag/attribute list, and rearranges tags and attributes in the XML document before compressed such that they are in the same order as the order (a predetermined order) of tags and attributes in the tag/attribute list. When the order of a start tag and an end tag, being paired, is changed, the tag/attribute rearranging unit 153 moves an element content described between the start tag and the end tag, as well.

The omitted tag/attribute supplementing unit 154 supplements a tag or attribute omitted in the XML document, having been processed by the tag/attribute rearranging unit 153, according to the tag/attribute list held in the tag/attribute list holding unit 152. Namely, the omitted tag/attribute supplementing unit 154 compares the inputted XML document with the tag list. When detecting a missing tag or attribute in the XML document, the omitted tag/attribute supplementing unit 154 reads out from the tag/attribute list a tag or attribute corresponding to the missing tag or attribute, and supplements the missing tag or attribute. When supplementing a start tag and an end tag, being paired, the omitted tag/attribute supplementing unit 154 leaves an element content, described between the start tag and the end tag, empty. When supplementing an attribute, the omitted tag/attribute supplementing unit 154 sets a default value or the like as an attribute value.

The XML document undergone the processes by the tag/attribute rearranging unit 153 and by the omitted tag/attribute supplementing unit 154 is inputted to the structured document compressing apparatus 130 according to the third embodiment.

Next, description will be made of an operation of the structured document compressing apparatus 150 in the above structure according to the modification of the fourth embodiment.

In the structured document compressing apparatus 150 shown in FIG. 12, the inputting unit 151 captures an XML document that is an object of compression, and the tag/attribute rearranging unit 153 compares the XML document with the tag/attribute list. With any deficiency such as reversal in the order of description of tags and attributes in the XML document, tags and attributes in the XML document before compressed are rearranged such that the order of description of the tags and attributes in the XML document is matched with the order of arrangement of tags and attributes in the tag/attribute list.

The XML document undergone the rearranging process is inputted to the omitted tag/attribute supplementing unit 154. The omitted tag/attribute supplementing unit 154 compares the XML document with the tag/attribute list. When detecting a tag or attribute missing in the XML document, the omitted tag/attribute supplementing unit 154 reads out from the tag/attribute list a tag or attribute corresponding to the missing tag or attribute, and supplements the missing tag or attribute.

As a result, the XML document having deficiency in description of tags and attributes is normalized (properly arranged) so as to have a data structure matching the tag/attribute list.

Namely, the processing by the tag/attribute rearranging unit 153 and by the omitted tag/attribute supplementing unit 154 is performed on all the XML documents that are to be compressed by the structured document compressing apparatus 130, whereby all the XML documents are normalized so as to have a data structure matching the tag/attribute list.

The XML document normalized as above is inputted to the structured document compressing apparatus 130 to be compressed as described above in the third embodiment. The XML document, now being free from deficiencies passes through the tag/attribute rearranging unit 153 and the omitted tag/attribute supplementing unit 154, and is then inputted to the structured document compressing apparatus 130.

In the structured document compressing apparatus 140, 150 according to the fourth embodiment, tags and attributes in an XML document before compressed are rearranged in a predetermined order according to a tag list or a tag/attribute list that defines a predetermined data structure, and a tag or attribute missing from the XML document is supplemented. Whereby, an XML document involving deficiency such as reversal in the order of description of tags or attributes, or missing description of a tag or attribute, for instance, is normalized such as to have a predetermined data structure.

Even when an XML document involving deficiencies is included in a number of object XML documents having a common data structure, all the XML documents to be compressed are normalized before undergoing the compressing process so as to have a predetermined data structure defined by a tag list or tag/attribute list. It is therefore possible to certainly manage and handle a number of compressed XML documents according to a single tag list or tag/attribute list.

[5] Description of Fifth Embodiment

FIG. 13 is a block diagram showing a construction of a structured document compressing apparatus and a structured document decompressing apparatus according to a fifth embodiment of this invention.

The structured document compressing apparatus 160 and the structured document decompressing apparatus 260 shown in FIG. 13 forms part of a structured document processing system for processing XML documents.

The structured document compressing apparatus 160 according to the fifth embodiment compresses XML documents. As shown in FIG. 13, the structured document compressing apparatus 160 comprises an inputting unit 161, a subdocument extracting unit 162, a subdocument unifying unit 163 and an outputting unit 164, along with the units of any one of the structured document compressing apparatuses 120, 130, 140 and 150.

The structured document decompressing apparatus 260 according to the fifth embodiment decompresses compressed XML documents (compressed data) generated by the structured document compressing apparatus 160, thus reconstructing the original XML documents. As shown in FIG. 13, the structured document decompressing apparatus 260 comprises an inputting unit 161, a subdocument extracting unit 162, a subdocument unifying unit 163 and an outputting unit 164, along with the units of either one of the above-described structured document decompressing apparatuses 220 and 230.

The structured document compressing apparatus 160 and the structured document decompressing apparatus 260 are provided on one and the same computer, or on respective different computers. Various functions of the structured document compressing apparatus 160 are realized by executing a predetermined program (structured document compressing program) on the computer. Similarly, various functions of the structured document decompressing apparatus 260 are realized by executing a predetermined program (structured document decompressing program) on the computer.

As shown in FIG. 13, the structured document compressing apparatus 160 and the structured document decompressing apparatus 260 have almost the same structure, except for a different unit arranged between the subdocument extracting unit 162 and the subdocument unifying unit 163.

In the structured document compressing apparatus 160 shown in FIG. 13, the inputting unit 161 captures an object XML document to be compressed, stored in a hard disk or the like (refer to reference character 300 in FIG. 1, for example). The subdocument extracting unit 162 extracts a subdocument, or a region sandwiched between a start tag and an end tag that have a predetermined element name, from the inputted XML document, and outputs the subdocument to any one of the structured document compressing apparatuses 120, 130, 140, and 150 (hereinafter, the structured document compressing apparatus 120 in the fifth embodiment).

The subdocument unifying unit 163 receives a result of compression of the subdocument from the structured document compressing apparatus 120, and unifying the result of compression and parts other than the subdocument. The outputting unit 164 outputs a compressed XML document unified by the subdocument unifying unit 163, as a result of compression, to a hard disk or the like (refer to reference characters 400, 410, 420, 440 in FIGS. 1, 2, and 15 through 17, for example), and stores the compressed XML document therein.

In the structured document decompressing apparatus 260 shown in FIG. 13, the inputting unit 161 captures a compressed XML document that is an objective of decompression from a record medium or the like (for example, a hard disk 400, 410, 420, and 440 shown in FIGS. 1, 2, 15, 16, and 17). The subdocument extracting unit 162 extracts a region sandwiched between a start tag and an end tag that have a predetermined element name, as a subdocument, from the inputted compressed XML document, and outputs the subdocument to the structured document decompressing apparatus 220, 230 (hereinafter, the structured document decompressing apparatus 220 in the fifth embodiment).

The subdocument unifying unit 163 receives a result of decompression of the subdocument from the structured document decompressing apparatus 220, and unifies the result of the decompression and parts other than the subdocument. The outputting unit 164 outputs an XML document unified by the subdocument unifying unit 163, as a result of decompression, to a record medium or the like (hard disk 300 shown in FIG. 1, for example), and stores the XML document therein.

When the structured document decompressing apparatus 220 is employed in the structured document compressing apparatus 260, a tag list used in the structured document decompressing apparatus 220 is beforehand generated by listing tags in a subdocument in the order of appearance and stored in a database (not shown) or the like. When the structured document decompressing apparatus 230 is employed in the structured document compressing apparatus 260, a tag/attribute list used in the structured document decompressing apparatus 230 is beforehand generated by listing tags and attributes in a subdocument in the order of appearance and stored in a database (now shown) or the like, as well.

Next, description will be made of operations of the structured document compressing apparatus 160 and the structured document decompressing apparatus 260 in the above structures according to the fifth embodiment.

In the structured document compressing apparatus 160 shown in FIG. 13, the inputting unit 161 captures an XML document that is an object of compression. The subdocument extracting unit 162 then extracts from the XML document a subdocument, a region sandwiched between a start tag and an end tag that have a predetermined element name, and outputs the subdocument to the structured document compressing apparatus 120.

In the structured document compressing apparatus 120, the inputted subdocument is receives the compressing process described above in the second embodiment so that the compressed subdocument in which each tag is replaced with a predetermined delimiter code is generated.

The compressed subdocument is unified with parts other than the subdocument by the subdocument unifying unit 163, and is outputted from the outputting unit 164 as a result of the compression.

Now, a practical compressed state of an XML document according to the fifth embodiment will be described with reference to FIGS. 14A and 14B. FIGS. 14A and 14B show examples of data according to the fifth embodiment. FIG. 14A is a diagram showing an example of an XML document including a plurality of subdocuments. FIG. 14B is a diagram showing a compressed state of the XML document in FIG. 14A.

FIG. 14A shows an XML document of an order slip including a plurality (three in the drawing) of subdocuments having a common data structure as an example of an XML document before compressed, that is, an XML document that is an object of compression. In the XML document shown in FIG. 14A, there are three regions each sandwiched between a start tag "<PRODULT>" and an end tag "</PRODUCT>". These regions have exactly the same data structure. Namely, in each of the regions, tags and element contents for a manufacturer, a product number, and a price, are described, where, the element contents described in these regions differ from one another.

When the structured document compressing apparatus 160 compresses the XML document shown in FIG. 14A, the subdocument extracting unit 162 extracts the three subdocuments, the regions each sandwiched between a start tag "<PRODUCT>" and an end tag "</PRODUCT>" from the XML document shown in FIG. 14A as the start tag "<PRODUCT>" and the end tag "</PRODUCT>" are given as reference keys for the extraction of the subdocument.

As a result of compression of each of the extracted subdocuments by the structured document compressing apparatus 120, the tags have been replaced with a delimiter code ",", in each of the subdocuments. The subdocuments undergone the replacing process and parts other than the subdocuments are unified by the subdocument unifying unit 163, whereby a compressed XML document as shown in FIG. 14B is generated.

In the structured document decompressing apparatus 260 shown in FIG. 13, the inputting unit 161 captures a compressed XML document as shown in FIG. 14B as an object of decompression, and the subdocument extracting unit 162 extracts a region sandwiched between the start tag "<PRODUCT>" and the end tag "</PRODUCT>" (substantial compressed XML document), as a subdocument, from the compressed XML document, in the similar manner to the compressing process. The subdocument (compressed XML document) is outputted to the structured document decompressing apparatus 220.

In the structured document decompressing apparatus 220, the decompressing process described in the second embodiment is performed on the inputted subdocument, so that the delimiter codes are replaced with appropriate tags, and the subdocument is decompressed to the original XML document.

The decompressed subdocument is unified with parts other than the subdocument by the subdocument unifying unit 163, and the unified XML document is outputted from the outputting unit 164 as the result of the decompression.

According to the structured document compressing apparatus 160 in the fifth embodiment of this invention, when more than one regions (subdocuments) having a common data structure exist in one XML document, the subdocuments are extracted from the XML document, and tags in each of the subdocuments are replaced with a delimiter code ",". It is thereby possible to compress the XML document to decrease a data quantity of the XML document, without impairing the visual recognizability of the data structure of each subdocument or flexibility/expandability, which forms part of the advantages of XML documents.

Therefore, it is possible to decrease an amount of a storage area (for example, the hard disk 400, 410, 420 and 440 shown in FIGS. 1, 2, and 15 through 17) needed to store XML documents, and also to increase a transmission speed for XML document data, like the first and second embodiments.

According to the structured document decompressing apparatus 260 in the fifth embodiment, when an XML document, containing a subdocument that is compressed as above, is decompressed, the reconstruction of the original structured document can be readily done by a simple process of replacing delimiter codes that are detected in the subdocument to be decompressed with predetermined tags, while correlating the delimiter code with a tag on the tag list for the subdocuments.

[6] Description of a Tag List Collective Managing Method

Next, description will be made of a method for collectively managing tag lists according to this embodiment when plural types of data structures (that is, plural types of tag lists) are managed in one structured document processing system, with reference to FIGS. 15 through 18. FIGS. 15 through 17 are diagrams for illustrating a first to third examples of the tag list collective managing method according to this embodiment. FIG. 18 is a diagram showing an example of addition of tag-list identification information in the second and third examples of the tag list collective managing method according to this embodiment.

In a structured document processing system shown in FIG. 15, more than one (three in FIG. 15) compressed XML documents generated by the structured document compressing apparatus, 120 to 160, are stored in a hard disk (database) 410. It is assumed here that the three pieces of identification information (identifiers) 1, 2, 3 are respectively given to the three compressed XML documents.

The hard disk 410 has a tag-list-group holding unit 411 and a tag list managing unit 412.

The tag-list-group holding unit 411 holds more than one (two in FIG. 15) types of tag lists corresponding to data structures of XML documents to be processed. It is assumed here that the two pieces of tag-list identification information (tag list identifiers) A, B are respectively given to the two types of tag lists.

The tag list managing unit 412 collectively manages correspondence between the pieces of identification information 1, 2, 3 of the XML documents generated by the structured document compressing apparatus, 120 to 160, and tag lists A, B held in the tag-list-group holding unit 411, using a table. In a table of the tag list managing unit 412 shown in FIG. 15, for example, compressed XML documents 1, 2, 3 are correlated with tags lists A, A, B, respectively.

The tag list managing unit 412 collectively manages tag lists required when the plural compressed XML documents held in the hard disk 410 are decompressed.

When decompressing a compressed XML document, the structured document decompressing apparatus 220, 230, 260 searches, in the table of the tag list managing unit 412 with using identification information of the compressed XML document as a key, for tag-list identification information corresponding to the identification information of the compressed XML document. The structured document decompressing apparatus 220, 230, 260 reads out a tag list specified by the tag-list identification information from the tag list holding unit 411 provided in the hard disk 410, and uses the tag list in the decompressing process executed on the compressed XML document as described above.

In a structured document processing system shown in FIG. 16, a hard disk (database) 420 stores more than one (three in FIG. 16) compressed XML documents 1, 2, 3, generated by the structured document compressing apparatus, 120 to 160, and has a tag-list-group holding unit 411 similar to that shown in FIG. 15.

The structured document compressing apparatus, 120 to 160, are accessibly connected to the hard disk 420, as well as the structured document decompressing apparatus, 220, 230, 260. The structured document compressing apparatus, 120 to 160, are provided with a tag-list identification information adding unit 171, whereas the structured document decompressing apparatus 220, 230, 260 is provided with a tag-list identification information obtaining unit 172.

The tag-list identification information adding unit 171 adds tag-list identification information used to specify a tag list corresponding to a compressed XML document to the compressed XML document generated by the structured document compressing apparatus, 120 through 160. The tag-list identification information obtaining unit 172 obtains the tag-list identification information added to a compressed XML document.

When a compressed XML document is generated by the structured document compressing apparatus, 120 through 160, the tag-list identification information adding unit 171 writes tag-list identification information (identifier) corresponding to the compressed XML document, as an attribute, in a start tag of the compressed XML document to add the tag-list identification information thereto, as shown in FIG. 18, for example. In an example shown in FIG. 16, three pieces of tag-list identification information A, A, B are added to compressed XML documents 1, 2, 3, respectively. FIG. 18 shows an example in which the tag-list identification information A is inserted as an attribute "TAG='TAG_LIST-A'" in a start tag "<PRODUCT>" in the compressed XML document 1 or 2.

When the structured document decompressing apparatus 220, 230, 260 decompresses a compressed XML document, the tag-list identification information obtaining unit 172 obtains the tag-list identification information added to the compressed XML document. The structured document decompressing apparatus 220, 230, 260 reads out a tag list specified by the tag-list identification information from the tag-list-group holding unit 411 provided in the hard disk 420, and uses the read-out tag list in the decompressing process carried out as described above on the compressed XML document.

In a structured document processing system shown in FIG. 17, a tag-list-group holding unit 411 similar to that shown in FIG. 15 is provided in a hard disk (database) 430 in a management server 600.

The management server 600 is communicably connected to the structured document compressing apparatus, 120 to 160, and structured document decompressing apparatus 220, 230, 260 over a network 700 such as LAN. The structured document compressing apparatuses 120 to 160 and the structured document decompressing apparatuses 220, 230 and 260 are accessibly connected to the hard disk (database) 440. The hard disk 440 stores compressed XML documents, which are generated by the structured document compressing apparatus, 120 to 160, each having tag-list identification information added, like the example shown in FIG. 16.

When the structured document compressing apparatus, 120 to 160, generates a compressed XML document, the tag-list identification information adding unit 171 writes tag-list identification information (identifier) corresponding to the compressed XML document as an attribute, in a start tag of the compressed XML document, as shown in, for example, FIG. 18, like the system shown in FIG. 16. In the example shown in FIG. 17, the three pieces of tag-list identification information A, A, B are added to the compressed XML documents 1, 2, 3, respectively.

When the structured document decompressing apparatus 220, 230, 260 decompresses a compressed XML document, the tag-list identification information obtaining unit 172 obtains tag-list identification information added to the compressed XML document. The structured document decompressing apparatus 220, 230, 260 reads a tag list specified by the tag-list identification information from the tag-list-group holding unit 411 in the hard disk 430 (that is, on the management server 600) over the network 700, and uses it in the decompressing process as described above on the compressed XML document.

In the structured document processing systems shown in FIGS. 15 to 17, the tag list managing unit 412 manages correspondence between compressed XML documents and tag lists, and adds, to the XML documents, tag-list identification information specifying a tag list corresponding to each of the XML documents, thereby collectively managing tag list groups. It is therefore possible to certainly understand correspondence between compressed XML documents and tag lists, and decompress a compressed XML document on the basis of a tag list corresponding to the compressed XML document.

Accordingly, even when XML documents (compressed XML documents) including ones having different types of data structures (that is, tag lists) are processed by a system that handles XML documents while performing the compressing/decompressing process on the XML documents, it is possible to certainly obtain a tag list corresponding to each compressed XML document to perform the decompressing process without causing confusion.

The structured document processing system shown in FIG. 17 holds and manages tag list groups on the management server 600, and reads out a tag list required in the processing, from the management server 600 over the network 700, thereby collectively managing the tag list groups. In consequence, it becomes unnecessary to manage plural types of tag lists for each structured document compressing apparatus or structured document decompressing apparatus, thus the tag lists can be shared by the plurality of structured document compressing apparatuses and structured document decompressing apparatuses.

In the systems shown FIGS. 15 through 18, tag list groups are collectively managed. Additionally, tag/attribute list groups are collectively managed, too.

[7] Others

Note that the present invention is not limited to the above embodiments, but may be modified in various ways without departing from the scope of the invention.

For instance, the above embodiments have been described by way of examples in which a structured document is in XML. However, the present invention is not limited to this. The present invention may also be applied to a structured document (in SGML or the like) similar to an XML document described using tags in the similar way, providing the similar functions and effects.

In the above embodiments have been described by way of example where "," or "/" or "=" is used as a delimiter code. However, the present invention is not limited to this. Other characters or signs may be used as delimiter codes. In such case, also, the present invention can provide the similar functions and effects to the above embodiments.

What is claimed is:

1. An apparatus for compressing a plurality of structured documents having a common data structure and including a plurality of kinds of markup tags, said apparatus comprising:
    a tag list obtaining unit obtaining a single tag list, common to said plurality of structured documents, that lists start markup tags and end markup tags in the order that they appear in each of the plurality of structured documents, by removing element contents from the structured documents;
    a structured document compressing unit, by replacing all of the plurality of kinds of markup tags in each of said plurality of structured documents with a same single predetermined delimiter code, generating a plurality of compressed documents comprising element contents and same predetermined delimiter codes; and
    an outputting unit outputting said single tag list, which is obtained by said tag list obtaining unit, and also said plurality of compressed documents, which are generated individually from said plurality of structured documents by said structured document compressing unit, in correspondence with one another.

2. A structured document compressing apparatus according to claim 1, wherein said structured document compressing unit further comprises:
    a tag detecting unit detecting each start markup tag and end markup tag in individual said structured documents; and
    a tag replacement unit replacing each start markup tag and end markup tag, detected by said tag detecting unit, with said predetermined delimiter code.

3. An apparatus for compressing a plurality of structured documents having a common data structure, said apparatus comprising:
    a tag detecting unit detecting all start markup tags and end markup tags in each of said plurality of structured documents; and
    a tag replacement unit replacing all start markup tags and end markup tags detected by said tag detecting unit, with a same single predetermined delimiter code, to translate each of said plurality of structured documents into a compressed document comprising element contents and same predetermined delimiter codes.

4. A structured document compressing apparatus according to claim 3, further comprising:
    an attribute-bearing-tag discriminating unit discriminating whether or not said markup tag detected by said tag detecting unit is an attribute-bearing markup tag, which has an attribute value; and
    an attribute-bearing-tag replacement unit replacing said attribute-bearing markup tag, discriminated by said attribute-bearing-tag discriminating unit, with a set of the attribute value and a same single predetermined delimiter code.

5. A structured document compressing apparatus according to claim 4, further comprising:
    a tag/attribute list holding unit holding a tag/attribute list in which start markup tags, end markup tags and an attribute name are listed in a predetermined order for the definition of a predetermined data structure;
    a tag/attribute rearranging unit rearranging start markup tags, end markup tags and an attribute in individual said plurality of structured documents to be compressed, in the predetermined order according to the tag/attribute list held in said tag/attribute list holding unit; and
    an omitted tag/attribute supplementing unit supplementing a start markup tag and an end markup tag and/or an attribute omitted in individual said plurality of structured documents according to the tag/attribute list held in said tag/attribute list holding unit.

6. A structured document compressing apparatus according to claim 3, further comprising:
    a tag list holding unit holding a tag list in which start markup tags and end markup tags are listed in a predetermined order for definition of a predetermined data structure;
    a tag rearranging unit rearranging start markup tags and end markup tags in individual said plurality of structured documents before compression, in the predetermined order according to the tag list held in said tag list holding unit; and an omitted-tag supplementing unit supplementing a start markup tag and an end markup tag omitted in said structured document according to said tag list held in said tag list holding unit.

7. An apparatus for compressing a structured document, said apparatus comprising:
   a subdocument extracting unit extracting a plurality of subdocuments having a common data structure, each of which is a region sandwiched between a start markup tag and an end markup tag that have a predetermined element name, from said structured document;
   a tag detecting unit detecting each of said start markup tags and end markup tags in individual said plurality of subdocuments extracted by said subdocument extracting unit; and
   a tag replacement unit replacing each of said start markup tags and end markup tags, detected by said tag detecting unit, with a same single predetermined delimiter code, to translate said structured document into a compressed document comprising element contents and same predetermined delimiter codes.

8. A structured document compressing apparatus according to claim 7, further comprising:
   an attribute-bearing-tag discriminating unit discriminating whether or not said markup tag detected by said tag detecting unit is an attribute-bearing markup tag, which has an attribute value; and
   an attribute-bearing-tag replacement unit replacing said attribute-bearing markup tag, discriminated by said attribute-bearing-tag discriminating unit, with a set of the attribute value and a same single predetermined delimiter code.

9. A structured document compressing apparatus according to claim 8, further comprising:
   a tag/attribute list holding unit holding a tag/attribute list in which start markup tags, end markup tags and an attribute name are listed in a predetermined order for the definition of a predetermined data structure;
   a tag/attribute rearranging unit rearranging start markup tags, end markup tags and an attribute in said structured document to be compressed, in the predetermined order according to the tag/attribute list held in said tag/attribute list holding unit; and
   an omitted tag/attribute supplementing unit supplementing a start markup tag and an end markup tag and/or an attribute omitted in said structured document according to the tag/attribute list held in said tag/attribute list holding unit.

10. A structured document compressing apparatus according to claim 7, further comprising:
    a tag list holding unit holding a tag list in which start markup tags and end markup tags are listed in a predetermined order for definition of a predetermined data structure;
    a tag rearranging unit rearranging start markup tags and end markup tags in said structured document before compressed, in the predetermined order according to the tag list held in said tag list holding unit; and
    an omitted-tag supplementing unit supplementing a start markup tag and an end markup tag omitted in said structured document according to said tag list held in said tag list holding unit.

11. A method for compressing a plurality of structured documents having a common data structure using a computer, said method comprising:
    obtaining a single tag list, common to said plural structured documents, that lists start markup tags and end markup tags in order that they appear in the structured documents, by removing element contents;
    replacing all of said start markup tags and end markup tags in each of said plural structured documents that correspond to the tag list in said plural structured documents with a same single predetermined delimiter code, to generate a plurality of compressed documents comprising same predetermined delimiter codes and element contents; and
    outputting the single tag list and the plurality of compressed documents generated from said plural structured documents, in correspondence with one another.

12. A method for compressing a plurality of structured documents having a common data structure using a computer, where the structured document comprises content start markup tags and end markup tags that are separate from the content and the markup tags structure the content, said method comprising:
    detecting all start markup tags and end markup tags in each of said plurality of structured documents; and
    replacing all start markup tags and end markup tags with a same single predetermined delimiter code, to translate each of said plurality of structured documents into a compressed document comprising element contents and same predetermined delimiter codes.

13. A method for compressing a structured document using a computer, said method comprising:
    extracting a plurality of structure subdocuments having a common data structure, each of which is a region sandwiched between a start markup tag and an end markup tag that have a predetermined element name, from said structured document;
    detecting all start markup tags and end markup tags in each of said plurality of subdocuments; and
    replacing all start markup tags and end markup tags with a same single predetermined delimiter code, to translate said structured document into a compressed document comprising element contents and same predetermined delimiter codes.

14. A computer readable recoding medium which stores a structured document compressing program for instructing a computer to execute a function of compressing a plurality of structured documents having a common data structure, wherein said structured document compressing program instructs the computer to function as:
    a tag list obtaining unit obtaining a single tag list, common to said plural structured documents, that lists start markup tags and end markup tags in order that they appear in the structured documents, by removing element contents;
    a structured document compressing unit, by replacing all start markup tags and end markup tags in each of said plural structured documents that correspond to the tag list in said plural structured documents with a same single predetermined delimiter code, generating a plurality of compressed documents comprising said the same single predetermined delimiter and element contents; and
    an outputting unit outputting said single tag list, which is obtained by said tag list obtaining unit, and also said plurality of compressed documents, which are generated individually from said plural structured documents by said structured document compressing unit, in correspondence with one another.

15. A computer readable recording medium which stores a structured document compressing program for instructing a computer to execute a function of compressing a plurality of structured documents having a common data structure, wherein said structured document compressing program instructs the computer to function as:

a tag detecting unit detecting all start markup tags and end markup tags in each of said plurality of structured documents; and a tag replacement unit replacing all start markup tags and end markup tags, detected by said tag detecting unit, with a same single predetermined delimiter code, to translate each of said plurality of structured documents into a compressed document comprising element contents and same predetermined delimiter codes.

16. A computer readable recording medium which stores a structured document compressing program for instructing a computer to execute a function of compressing a structured document, wherein said structured document compressing program instructs the computer to function as:

a subdocument extracting unit extracting a plurality of subdocuments having a common data structure, which is a region sandwiched between a start markup tag and an end markup tag that have a predetermined element name, from said structured document;

a tag detecting unit detecting each all start markup tags and end markup tags in each of said plurality of subdocuments extracted by said subdocument extracting unit; and a tag replacement unit replacing all start markup tags and end markup tags, detected by said tag detecting unit, with a same single predetermined delimiter code, to translate said structured document into a compressed document comprising element contents and same predetermined delimiter codes.

17. An apparatus, comprising:

a structured document compressor generating a plurality of compressed documents by replacing all start markup tags and end markup tags in a plurality of original structured documents having a common data structure and element contents, with a same single predetermined delimiter based upon, a tag list in which start markup tags and end markup tags in said plural structured documents are listed in order of appearance by removing the element contents;

a duplicating unit expanding/duplicating a data structure corresponding to said tag list, as a duplicated data structure, on a memory; and a writing unit writing element contents of each of said compressed documents into predetermined regions of said duplicated data structure extended on said memory, in accordance with a correspondence between a position of a start markup tag or an end markup tag in said duplicated data structure and a position of the same single predetermined delimiter code in each of said compressed documents.

18. An apparatus comprising:

a plurality of compressed documents generated by replacing all start markup tags and end markup tags in a plurality of structured documents having a common data structure and element contents, with a same single predetermined delimiter;

a tag list holding unit holding a tag list in which markup tags in said structured document are listed in order of appearance by removing the element contents;

a delimiter code detecting unit detecting the same single predetermined delimiter code in said compressed document; and a tag restoring unit replacing the same single predetermined delimiter code, detected by said delimiter code detecting unit, with a corresponding markup tag on said tag list, in accordance with a correspondence between a position of the markup tag in said tag list and a position of the same single predetermined delimiter code detected by said delimiter code detecting unit.

19. A structured document decompressing apparatus according to claim 18, wherein if an attribute inside an attribute-bearing markup tag in each of said plurality of original structured documents is replaced with a set of an attribute value and a same single predetermined delimiter code in each of said plurality of compressed documents, said apparatus further comprises:

an attribute list holding unit holding an attribute list in which attribute names in each of said plurality of compressed documents are listed in order of appearance;

an attribute-bearing-tag discriminating unit discriminating whether a given markup tag to be restored by said tag restoring unit is an attribute-bearing markup tag; and an attribute-bearing-tag restoring unit restoring said attribute-bearing markup tag discriminated by said attribute-bearing-tag discriminating unit, in accordance with a correspondence between an attribute value for said attribute-bearing markup tag and an attribute name in said attribute list.

20. An apparatus comprising:

a compressed document generated by replacing all start markup tags and end markup tags in a plurality of subdocuments having a common data structure, each of which is a region, in an original structured document, sandwiched between a start markup tag and an end markup tag that have a predetermined element name and element contents, with a same single predetermined delimiter code;

a tag list holding unit holding a tag list in which markup tags in each of said plurality of subdocuments are listed in order of appearance by removing the element contents;

a subdocument extracting unit extracting each of said plurality of subdocuments from said compressed document;

a delimiter code detecting unit detecting the same single predetermined delimiter code in each of said plurality of subdocuments extracted by said subdocument extracting unit; and a tag restoring unit replacing the same single predetermined delimiter code, detected by said delimiter code detecting unit, with a corresponding start markup tag or end markup tag on said tag list, in accordance with a correspondence between a position of the start markup tag or the end markup tag in said tag list and a position of the same single predetermined delimiter code detected by said delimiter code detecting unit.

21. A structured document decompressing apparatus according to claim 20, wherein if an attribute inside an attribute-bearing markup tag in said structured document is replaced with a set of an attribute value and a same single predetermined delimiter code in said compressed document, said apparatus further comprises:

an attribute list holding unit holding an attribute list in which attribute names in said compressed document are listed in order of appearance;

an attribute-bearing-tag discriminating unit discriminating whether a given markup tag to be restored by said tag restoring unit is an attribute-bearing markup tag; and an attribute-bearing-tag restoring unit restoring said attribute-bearing markup tag discriminated by said attribute-bearing-tag discriminating unit, in accordance with a correspondence between an attribute value for said attribute-bearing markup tag and an attribute name in said attribute list.

22. A method comprising:

generating a plurality of compressed documents by replacing all start markup tags and end markup tags in a plurality of structured documents having a common data structure and element contents, with a same single predetermined delimiter code based upon a tag list in which start markup tags and end markup tags in said plural structured documents are listed in order of appearance by removing the element contents;

expanding/duplicating a data structure corresponding to said tag list, as a duplicated data structure, on a memory; and writing element contents of each of said compressed documents into predetermined regions of said duplicated data structure extended on said memory, in accordance with a correspondence between a position of a start markup tag or an end markup tag in said duplicated data structure and a position of the same single predetermined delimiter code in each of said compressed documents.

23. A method comprising:

generating a plurality of compressed documents by replacing all start markup tags and end markup tags in a plurality of structured documents having a common data structure and element contents, with a same single predetermined delimiter code;

holding a tag list in which start markup tags and end markup tags in said structured document are listed in order of appearance by removing the element contents from the structured documents;

detecting the single predetermined delimiter code in each of said plurality of compressed documents; and replacing the detected single predetermined delimiter code with a corresponding start markup tag or end markup tag on said tag list, in accordance with a correspondence between a position of the detected single predetermined delimiter code and a position of the start markup tag or the end markup tag in said tag list.

24. A method comprising:

generating a compressed document by replacing all start markup tags and end markup tags in a plurality of subdocuments having a common data structure, each of which is a region, in an original structured document, sandwiched between a start markup tag and an end markup tag that have a predetermined element name and element contents, with a same single predetermined delimiter code;

holding a tag list in which start markup tags and end markup tags in each of said plurality of subdocuments are listed in order of appearance by removing the element contents;

extracting each of said plurality of subdocuments from said compressed document;

detecting the same single predetermined delimiter code in each of said extracted plurality of subdocuments; and replacing the detected same single predetermined delimiter code with a corresponding start markup tag or end markup tag on said tag list, in accordance with a correspondence between a position of the detected same single predetermined delimiter code and a position of the start markup tag or the end markup tag in said tag list.

25. A computer readable recording medium encoded with instructions for instructing a computer to execute operations comprising:

generating a plurality of compressed documents by replacing all start markup tags and end markup tags, in a plurality of structured documents having a common data structure, which have element contents and delimiter codes, with a same single predetermined delimiter code based upon a tag list in which start markup tags and end markup tags in said plural structured documents are listed in order of appearance by removing the element contents;

a duplicating unit expanding/duplicating a data structure corresponding to said tag list, as a duplicated data structure, on a memory; and a writing unit writing element contents of each of said compressed documents into predetermined regions of said duplicated data structure extended on said memory, in accordance with a correspondence between a position of a start markup tag or an end markup tag in said duplicated data structure and a position of the same single predetermined delimiter code in each of said compressed documents.

26. A computer readable recording medium encode with a instructions for instructing a computer to execute operations comprising:

generating a plurality of compressed documents by replacing all start markup tags and end markup tags, in a plurality of structured documents having a common data structure and element contents, with a same single predetermined delimiter code a delimiter code detecting unit detecting the same single predetermined delimiter codes in each of said plurality of compressed documents; and a tag restoring unit replacing the same single predetermined delimiter code, detected by said delimiter code detecting unit, with a corresponding start markup tag or end markup tag on a tag list in which start markup tags and end markup tags in each of said plurality of structured documents are listed in order of appearance by removing the element contents in accordance with a correspondence between a position of the start markup tag or the end markup tag in said tag list and a position of the same single predetermined delimiter code detected by said delimiter code detecting unit.

27. A computer readable recording medium encoded with a instructions for instructing a computer to execute operations comprising:

generating a compressed document by replacing all start markup tags and end markup tags in a plurality of subdocuments having a common data structure, each of which is a region, in an original structured document, sandwiched between a start markup tag and an end markup tag that have a predetermined element name and element contents, with a same single predetermined delimiter code;

a subdocument extracting unit extracting each of said plurality of subdocuments from said compressed document;

a delimiter code detecting unit detecting the same single predetermined delimiter code in each of said plurality of subdocuments extracted by said subdocument extracting unit; and a tag restoring unit replacing the same single predetermined delimiter code, detected by said delimiter code detecting unit, with a corresponding start markup tag or end markup tag on a tag list in which start markup tags and end markup tags in said subdocument are listed in order of appearance by removing the element contents in accordance with a correspondence between a position of the start markup tag or the end markup tag in said tag list and a position of the same single predetermined delimiter code detected by said delimiter code detecting unit.

* * * * *

UNITED STATES PATENT AND TRADEMARK OFFICE
CERTIFICATE OF CORRECTION

| | |
|---|---|
| PATENT NO. | : 7,856,595 B2 |
| APPLICATION NO. | : 09/826915 |
| DATED | : December 21, 2010 |
| INVENTOR(S) | : Noriko Itani |

Page 1 of 1

It is certified that error appears in the above-identified patent and that said Letters Patent is hereby corrected as shown below:

Column 35, Line 20 in Claim 16, delete "each all" and insert -- all --, therefor.

Column 35, Line 33 in Claim 17, after "of" delete "original".

Column 35, Line 36 in Claim 17, delete "upon," and insert -- upon --, therefor.

Column 38, Line 22 in Claim 26, after "code" insert -- ; --.

Column 38, Line 38 in Claim 27, before "instructions" delete "a".

Signed and Sealed this
Twenty-second Day of March, 2011

David J. Kappos
*Director of the United States Patent and Trademark Office*